US006850855B2

United States Patent
Kawai et al.

(10) Patent No.: US 6,850,855 B2
(45) Date of Patent: Feb. 1, 2005

(54) APPARATUS AND METHOD FOR INSPECTING WORKING OPERATIONS ON CIRCUIT SUBSTRATE, AND SYSTEM AND METHOD FOR FABRICATING ELECTRIC CIRCUIT

(75) Inventors: Takayoshi Kawai, Okazaki (JP); Kazuo Mitsui, Okazaki (JP)

(73) Assignee: Fuji Machine Manufacturing Company, Limited, Chiryu (JP)

( * ) Notice: Subject to any disclaimer, the term of this patent is extended or adjusted under 35 U.S.C. 154(b) by 106 days.

(21) Appl. No.: 10/265,411

(22) Filed: Oct. 7, 2002

(65) Prior Publication Data

US 2003/0125895 A1 Jul. 3, 2003

(30) Foreign Application Priority Data

Oct. 11, 2001 (JP) ........................................ 2001-314304

(51) Int. Cl.$^7$ ............................................. G01N 37/00
(52) U.S. Cl. ..................... 702/84; 700/95; 700/108; 700/109; 700/110
(58) Field of Search ............................. 702/84; 700/95, 700/108, 109, 110

(56) References Cited

U.S. PATENT DOCUMENTS 5,134,575 A * 7/1992 Takagi ........................ 382/147
5,245,421 A * 9/1993 Robertson et al. ........... 348/126
5,483,603 A * 1/1996 Luke et al. ................... 382/147
5,564,183 A * 10/1996 Satou et al. .................... 29/840
5,621,811 A * 4/1997 Roder et al. ................. 382/147
5,969,752 A * 10/1999 Belter ........................ 348/125
6,023,680 A * 2/2000 Wooster et al. ................. 705/7
6,330,352 B1 * 12/2001 Ishikawa et al. ............ 382/141
6,622,054 B1 * 9/2003 Okuda et al. .................. 700/51

* cited by examiner

Primary Examiner—John Barlow
Assistant Examiner—Anthony Dougherty
(74) Attorney, Agent, or Firm—Oliff & Berridge, PLC

(57) ABSTRACT

Where a result of operations to mount electronic components is inspected, for example, an operating procedure of an inspecting operation is determined on the basis of mounting-condition information such as used-device information relating to used suction nozzles, feeders and other devices, and mounting-result information such as information relating to recovery actions. The operating procedure may be determined on the basis of device-usage historical information as well. For instance, the inspection operation is performed on inspecting objects selected from the mounting objects, such as mounting objects mounted with nozzles of high mounting defect ratios, mounting objects mounted with feeders of long use, etc. Additional inspecting objects are selected such that the inspection can be effected within a predetermined time. The inspecting order may be determined so as to complete the inspection in a shortest possible time.

26 Claims, 16 Drawing Sheets

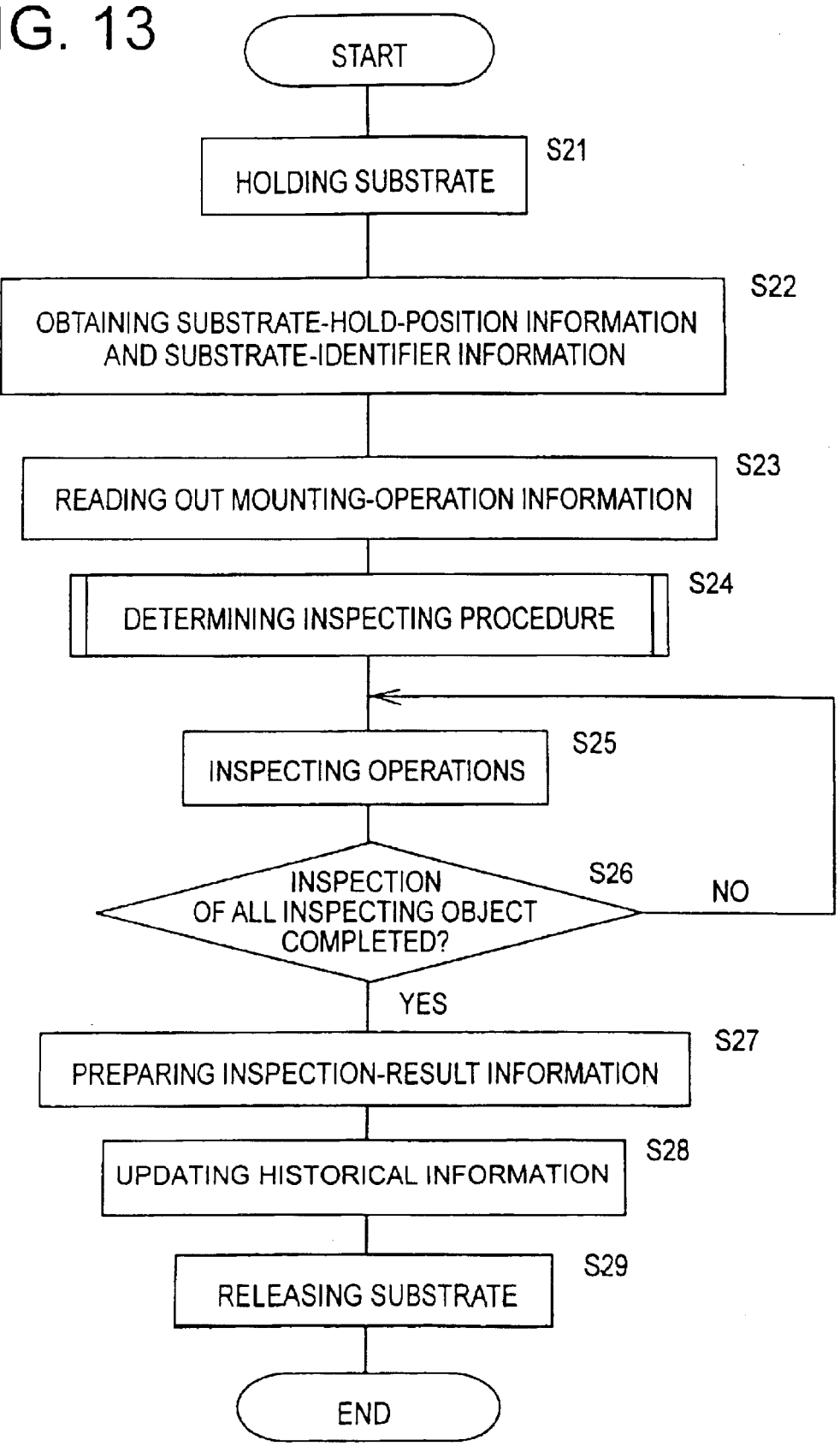

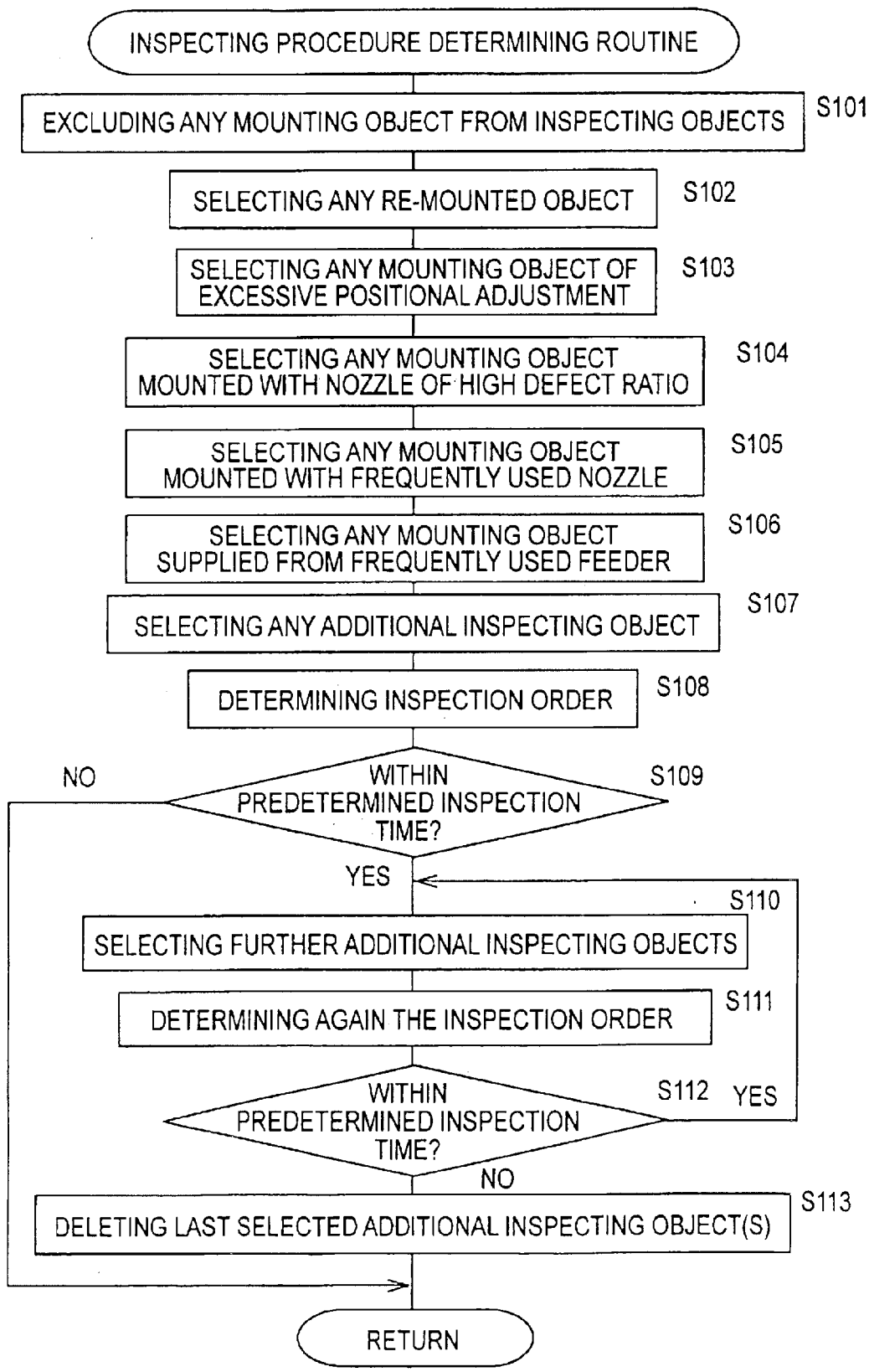

APPARATUS AND METHOD FOR INSPECTING WORKING OPERATIONS ON CIRCUIT SUBSTRATE, AND SYSTEM AND METHOD FOR FABRICATING ELECTRIC CIRCUIT

BACKGROUND OF THE INVENTION

1. Field of Invention

The present invention relates to an inspecting apparatus, an inspecting method and an inspecting program for inspecting a result of a working operation performed on a circuit substrate, and also relates to an electric-circuit fabricating system, an electric-circuit fabricating method and an electric-circuit fabricating program including such inspecting apparatus, method and program, respectively.

2. Description of Related Art

An electric circuit is fabricated by performing various working operations on a circuit substrate, such as a solder applying operation to apply by printing a creamy solder or a solder paste to predetermined spots on the circuit substrate, an adhesive applying operation to apply an adhesive agent to predetermined spots on the circuit substrate for fixing electric components (including electronic components), an electric-component mounting operation to mount the electric components at predetermined spots on the circuit substrate, a soldering operation to solder the mounted electric components. To assure correct working operations performed on the circuit substrate, the circuit substrate on which the working operations have been performed is usually subjected to an inspecting operation. The number of the working operations to be performed is increased as the required density of the electric components in the electric circuit and the structural complexity of the electric circuit are increased. Where the fabrication of the electric circuit includes a large number of working operations, accurate inspection of all of the performed working operations imposes a considerable burden. In this respect, there is a need of inspecting the working operations with high efficiency. For example, the time required to inspect the component mounting operations tends to be increased due to an increase in the number of the electric components required to be mounted and to satisfy a need of improving the accuracy of mounting of the electric components. Thus, there is a particularly high need of improving the efficiency of inspection of the component mounting operations.

SUMMARY OF THE INVENTION

It is therefore an object of the present invention to efficiently inspect the working operations performed on the circuit substrate. This object may be achieved according to any one of the following modes of this invention in the form of a substrate-working-result inspecting apparatus, a substrate-working-result inspecting method, a substrate-working-result inspecting program, an electric-circuit fabricating system, an electric-circuit fabricating method and an electric-circuit fabricating program, each of which is numbered like the appended claims and depends from the other mode or modes, where appropriate, for easy understanding of the invention. It is to be understood that the present invention is not limited to the technical features of the following modes or any combinations thereof. It is to be further understood that a plurality of elements or features included in any one of the following modes of the invention are not necessarily provided all together, and that the invention may be embodied with only selected one or ones of the elements or features described with respect to the same mode.

(1) A substrate-working-result inspecting apparatus for inspecting a result of substrate working operations performed on a circuit substrate, comprising:

an inspecting device for performing an inspecting operation, and an inspection control device provided with an operation control portion for controlling the inspecting device according to a determined operating procedure; and the inspection control device including an operating-procedure determining portion for determining the operating procedure of the inspecting operation on the circuit substrate, on the basis of substrate working information of the substrate working operations performed on the circuit substrate.

The substrate-working-result inspecting apparatus according to the present mode is capable of performing the inspecting operation to inspect the result of the substrate working operations performed on the circuit substrate, such that the inspecting operation is variable according to a condition and the result of the substrate working operations. For instance, the present inspecting apparatus can change the operating procedure by selecting inspecting objects and determining an order of the inspecting operation. Accordingly, the inspecting operation can be achieved with high efficiency. Further, the operating procedure can be determined for each circuit substrate, permitting the inspection operation with high flexibility. Specific forms of the substrate working operations, substrate working information and the determination of the operating procedure of the inspecting operation will be described with respect to the following modes of the invention.

(2) A substrate-working-result inspecting apparatus according to the above mode (1), wherein the substrate working operations are electric-component mounting operations to mount electric components on the circuit substrate, and the inspecting device inspects a result of mounting of the electric components mounted by the electric-component mounting operations.

In the present substrate-working-result inspecting apparatus, the substrate working operations to be inspected are not limited in kind. For example, the apparatus may inspect various kinds of substrate working operations, such as electric-component mounting operations to mount electric components, solder applying operations to apply a solder paste by printing, and adhesive applying operations to apply an adhesive agent. Where the inspecting apparatus is an apparatus to inspect a result of the electric-component mounting operations, namely, a component-mounting-result inspecting apparatus, in particular, there are a large number of electric components that should be inspected, imposing a considerable burden, as described before. In this respect, the component-mounting-result inspecting apparatus according to the present invention is advantageous. It is also noted that the conditions in which the electric-component mounting operations are performed may not be held constant, in most cases, depending upon the specific circuit substrates, for example, due to changes of operating devices such as suction nozzles used to mount the same electric components, which change may take place upon a failure of any suction nozzle to hold the electric component by suction and the following recovery action to re-hold the same electric component, as discussed below. In such cases, the inspecting apparatus according to the present invention is capable of changing the inspecting procedure on the basis of the substrate working information. In this respect, too, the present inspecting apparatus permits efficient inspection with high flexibility. In view of the above points, the following description of the following modes of the invention refers primarily to the inspecting apparatus to inspect the result of the component mounting operations.

In the component-mounting-result inspecting apparatus according to the present mode (2), the inspecting device is arranged to inspect the result of the electric-component mounting operations. Described in detail, the mounted components are inspected of their attitude, for example, their positioning errors. The inspecting operation uses an imaging device (including a CCD camera, a line sensor or other image-taking device) capable of imaging the surface of the circuit substrate, and includes operating the imaging device to take images of the mounted electric components, operating an image data processing device to process image data obtained by the imaging operation, to obtain the positioning errors of the electric components relative to the circuit substrate. In this case, the inspecting apparatus comprises an inspecting device, and an inspection control device having a function of controlling the inspecting device. The inspecting device includes a substrate holding device for holding the circuit substrate to be inspected, the above-indicated imaging device, and a moving device for moving the imaging device and the circuit substrate relative to each other, in a plane parallel to the surface of the circuit substrate. The inspection control device includes an operation control portion for controlling the inspecting device according to the determined operating procedure, and an operating-procedure determining portion for determining the operating procedure of the inspecting operation. For example, the operating-procedure determining portion is arranged to determine those of the mounted electric components which are to be inspected, and the order in which the determined electric components are inspected. The operating-procedure determining portion determines the operating procedure, on the basis of the substrate working information of the working operations performed on the circuit substrate. The substrate working information includes, for example, mounting-result information such as information relating to the electric components that could not be mounted, and mounting-condition information such as information relating to suction nozzles actually used for mounting the electric components, and information relating to the amounts of adjustment of the positions of the electric components after the imaging thereof. A specific manner of deterrnining the operating procedure will be described in detail, with respect to the following modes of the invention.

The inspecting apparatus arranged to inspect a result of the operation to apply a solder paste will be briefly described. For example, this inspecting apparatus is arranged to detect an amount of deviation of a screen-printed pattern of the solder paste from a nominal position of the pattern, and inspect this printed pattern for any chipping or breakage, by operating the inspecting device provided with an imaging device as described above. In this case, the substrate working infomnation relating to the application of the solder paste includes, for example, the contact pressure of a squeegee, speed of movement of the squeegee, width dimensions of selected portions of the printed pattern, and other information relating to the solder-paste applying condition. On the basis of these kinds of substrate working information, portions of the printed pattern that are to be inspected are selected to determine the operating procedure of the inspecting operation. Where the inspecting apparatus is arranged to inspect a result of the operation to apply an adhesive agent, the inspecting apparatus detects surface areas of the applied adhesive agent existing outside a predetermined coating region, and an amount of the applied adhesive agent at each coating spot, by operating the inspecting device provided with an imaging device as described above. Where the adhesive agent is delivered from a coating nozzle by operation of a screw pump so as to extrude the adhesive agent, the substrate working information relating to the application of the adhesive agent includes, for example, the diameter of the coating nozzle at a coating spot, number of rotations and rotating speed of the screw, and other information relating to the adhesive-agent applying condition. On the basis of these kinds of the substrate working information, portions of the circuit substrate that are to be inspected are selected to determine the operating procedure of the inspecting operation.

In the present inspecting apparatus, the number of the substrate working operations to be inspected is not limited. The substrate working operations to be inspected may be a plurality of working operations performed by a plurality of substrate working apparatuses. While the different kinds of substrate working operations have been described, the substrate working operations to be inspected are not limited to one of substrate working operations. For instance, the inspecting apparatus may be arranged to inspect the results of both the solder-paste applying operations and the adhesive-agent applying operations. Alternatively, the inspecting apparatus may be arranged to inspect the results of both the solder-paste applying operations and a part of the electric-component mounting operations.

(3) A substrate-working-result inspecting apparatus according to the above mode (1) or (2), wherein the operating-procedure determining portion determines the operating procedure of the inspecting operation, further on the basis of historical information relating to the substrate working operations.

Historical information indicating a tendency of change of defects of the past working operations and the total operating time is useful for the inspecting operation. For example, there is a high possibility that a working operation performed under a condition tending to cause an unacceptable result has a defective result. Further, a working operation performed with an operating device whose expected service life has been reached has a risk of unacceptable result. The inspection operation can be effected with high efficiency, by inspecting primarily such substrate working operations. The historical information used in the present mode includes a variety of information, as described below in detail with respect to the following modes of the invention. For instance, the variety of historical information includes defect ratios of all substrate working apparatuses used to perform the substrate working operations, a result of analysis of the defects of the same or similar working operations performed on the same or similar circuit substrates, a cumulative number of defects relating to each working object, and frequency of occurrence of defects depending upon the temperature, humidity and other environmental conditions. To determine the procedure of the inspecting operation, the results of the working operations performed on the circuit substrate are estimated on the basis of the historical information correlated with the substrate working information of the working operations performed on the circuit substrate to be inspected.

(4) A substrate-working-result inspecting apparatus according to the above mode (3), which is arranged to inspect a result of the substrate working operations performed by a substrate working apparatus provided with at least one working device, wherein the historical information includes at least one of device-defect historical information relating to a defective working operation caused by the operating device, and device-usage historical information relating to usage of the operating device, the substrate working information including used-device information relating to the operating device which performed the substrate working operation, the operating-procedure determining portion determining the operating procedure of said inspecting operation, on the basis of at least one of the device-defect historical information and the device-usage historical information, and the used-device information.

The present mode of the invention is one specific form of the above-indicated mode (3). Where the substrate working operations are operations to mount electric components, these mounting operations are performed by an electric-component mounting device, which is one kind of a substrate working apparatus. In this mounting device, the mounting operation is performed by using various operating devices such as suction nozzles, a mounting head or heads provided with the suction nozzles, and an electric-component supplying device provided with parts feeders for respective kinds of electric components. The historical information relating to those operating devices indicates the past and present state of the electri-component mounting device, and is useful information by which it is possible to forecast the future state of the mounting device. The inspecting operation can be effected efficiently by determining the procedure of the inspecting operation, on the basis of the historical information of the operating devices, which is correlated with the used-device information including information indicative of the working objects and the operating devices actually used to perform the working operations. The used-device information indicates the mounting spots at which the respective electric components are to be mounted, and the suction nozzles, etc. used to mount the respective electric components. The device-defect historical information includes various kinds of information, such as a defect ratio of each suction nozzle regarding the accuracy of mounting position, and the number of defective mounting operations consecutively performed by the mounting head, and a component-sucking failure ratio of each group of parts feeders where the parts feeders are classified into groups depending upon their positions. The device-usage historical information includes various kinds of information, such as the number of mounting operations performed by each of specific suction nozzles after the initial use, a total operating time of the mounting head after the last periodic adjustment, and a cumulative operating time of each parts feeder after the initial use. In the solder applying device (e.g., screen-printing device), adhesive-agent applying device (e.g., dispenser), etc., the operating devices include a squeegee and coating nozzles, and the device-defect historical information includes historical information relating to defective operations of the squeegee or coating nozzles, while the device-usage historical information includes historical information relating to the usage of the squeegee and coating nozzles. Further, the used-device information includes information indicative of the working operations performed by the squeegee and coasting nozzles.

(5) A substrate-working-result inspecting apparatus according to any one of the above modes (1)-(4), wherein the substrate working information includes working-failure-object information relating to working-failure objects which are working objects for which the substrate working operations were not performed, and wherein the operating-procedure determining portion includes an inspecting-object excluding portion for excluding the working-failure objects from inspecting objects to be inspected, on the basis of the working-failure-object information. If the working objects for which the substrate working operations were not performed are also inspected, the inspecting operation suffers from a loss of time. Where such working-failure objects are excluded from the inspecting objects, the required inspecting time can be shortened, permitting the inspecting operation with high efficiency. The working-failure-object information is a kind of working-result information. Where the substrate working operations are electric-component mounting operations, the electric components which were not mounted, and the corresponding mounting spots are the working-failure objects, that is, non-mounted objects. Information relating to the non-mounting objects is non-mounted-object information.

(6) A substrate-working-result inspecting apparatus according to any one of the above modes (1)-(5), wherein the operating-procedure determining portion includes a potentially-defective-object selecting portion for selecting, as the inspecting objects, at least potentially defective working objects from working objects for which the substrate working operations have been performed, the potentially defective objects having a high possibility that the substrate working operations performed on the potentially defective working objects are unacceptable.

Depending upon the condition in which the substrate working operations are performed, the substrate working operations performed on some of the working objects may be highly expected to be unacceptable. In the case of operations to mount the electric components, for example, some of the electric components are required to be mounted with relatively high accuracy. The working operations performed on these electric components requiring the high mounting accuracy are highly expected to be unacceptable. The unacceptable substrate working operations can be efficiently detected, by selecting such potentially defective working objects as the inspecting objects. In the present mode of the invention, only the potentially defective working objects may be selected as the inspecting objects. In this case, the number of the inspecting objects is relatively small, so that the inspecting operation can be advantageously completed in a relatively short time. Specific modes of the invention regarding the selection of the potentially defective working objects will be described below.

(7) A substrate-working-result inspecting apparatus according to the above mode (6), wherein the substrate working information includes re-worked-object information relating to re-worked objects for which the substrate working operations were performed again, and wherein the potentially-defective-object selecting portion recognizes the reworked objects as the potentially defective working objects, on the basis of the re-worked-object information.

Where the substrate working operations are operations to mount electric components, an electric-component mounting device which has failed to mount an electric component (due to a failure to hold the electric component by suction, for example) is automatically operated again to effect a recovery action to perform again an operation to mount the electric component. Since the first electric-component mounting operation had a cause for the failure to mount the electric component, there is a high possibility that the following recovery action fails again to mount the electric component. Thus, the re-worked objects for which the substrate working operations were performed again are considered to have a high possibility of a defect in the substrate working operations performed. In this respect, the inspecting operation can be effected with high efficiency in the present mode of the invention wherein the re-worked objects are recognized as the potentially defective working objects and selected as the inspecting objects.

(8) A substrate-working-result inspecting apparatus according to the above mode (6) or (7), wherein the operating-procedure determining portion determines the operating procedure of the inspecting operation, further on the basis of historical information relating to the substrate working operations, and wherein the potentially-defective-object selecting portion recognizes the potentially defective working objects, on the basis of the historical information.
!00231 In the present mode of the invention, the operating procedure is determined on the basis of the historical information discussed above. As described above, the historical information is useful for forecasting a defective working operation, so that the potentially defective working operations can be effectively recognized on the basis of this historical information. Since the historical information has been described with respect to the above modes, no further description thereof will be provided. Specific modes of the invention regarding the feature of the present mode will be described below.

(9) A substrate-working-result inspecting apparatus according to the above mode (8), which is arranged to inspect a result of the substrate working operations performed by a substrate working apparatus provided with at least one working device, and wherein the historical information includes at least one of device-defect information relating to a defective working operation caused by the operating device, and device-usage historical information relating to usage of the operating device, said substrate working information includes used-device information relating to the operating device which performed said substrate working operation, the potentially-defective-object selecting portion recognizing the potentially defective working objects, on the basis of at least one of the device-defect information and the device-usage information, and the used-device information.

Of the historical information, the device-defect historical information and the device-usage historical information are useful information, as described above, and can be used together with the used-device information, for accurately recognizing the potentially defective working objects. Where the substrate working operations are operations to mount electric components, the mounting objects for which the mounting operations have been performed with suction nozzles of high operational defect ratios are selected as the inspecting objects. The electric components supplied from parts feeders which have been used for long times may be selected as the inspecting objects in the present mode of the invention.

(10) A substrate-working-result inspecting apparatus according to anyone of the above modes (6)-(10), wherein the operating-procedure determining portion includes an additional-object selecting portion for selecting, as additional inspecting objects, some of the working objects which are other than the potentially defective working objects.

Where only the potentially defective working objects are selected as the inspecting objects to be inspected, the number of the inspecting objects is small, and the inspection can be advantageously effected in a short time, as described above. In the present mode of the invention, however, some of the other working objects are selected as the additional inspecting objects, so that the inspecting operation is effected more extensively. The additional inspecting objects are not particularly limited in the number and the order of selection, but may be selected as desired. For example, at least one of the working objects is selected at random as at least one additional inspecting object, or a predetermined number of the additional inspecting objects is selected in a predetermined order. Alternatively, all of the working objects are divided into a plurality of groups according to a predetermined rule, and these groups of working objects are selectively added to the inspecting objects. The additional inspecting objects may be selected in various manners depending upon the purpose of the inspection.

(11) A substrate-working-result inspecting apparatus according to the above mode (10), wherein the additional-object selecting portion selects the additional inspecting objects such that each of all of the working objects is inspected at a frequency not lower than a predetermined threshold.

Where only the potentially defective working objects are selected as the inspecting objects to be inspected, some of the other working objects are not selected as the inspecting objects for a long time. In the present mode of the invention wherein each of all the working objects is selected as an inspecting object, at the predetermined frequency or higher, the inspecting operation is effected with high reliability. Although the manner of selecting the additional inspecting objects is not particularly limited, some of the working objects are selected as the additional inspecting objects according to the predetermined order. The additional inspecting objects may be selected in various manners. For instance, the working objects which have not been selected as the inspecting objects during the substrate working operations performed on a predetermined number of circuit substrates, or for a predetermined time, may be selected as the additional inspecting objects.

(12) A substrate-working-result inspecting apparatus according to any one of the above modes (1)(1), wherein the operating-procedure determining portion includes a time-based selecting portion for selecting inspecting objects to be inspected, such that the inspecting operation is completed within a predetermined inspecting time. The amount of increase of the required working time for the fabrication of the electric circuit can be reduced to thereby maintain high productivity, by controlling the time required for the inspecting operation, for example. The predetermined inspecting time may be a constant time duration, or may be determined depending upon the specific circuit substrate under inspection, on the basis of the above-indicated substrate working information. Where the inspecting device is disposed within an electric-component fabricating line, for instance, the inspecting operation completed within the predetermined inspecting time reduces a possibility of disturbing the production tact time, permitting efficient fabrication of the electric circuits. Where the predetermined inspecting time is determined for each circuit substrate, depending upon the number of the above-described potentially defective working objects, the circuit substrates for which the working operations are highly expected to be unacceptable can be inspected extensively, so that the inspecting operation can be efficiently performed.

(13) A substrate-working-result inspecting apparatus according to any one of the above modes (I)(12), wherein the operating-procedure determining portion includes an inspecting-order determining portion for determining an order of inspection of inspecting objects to be inspected, so as to minimize a time required for inspecting the inspecting objects The time required for the inspecting operation varies depending upon not only the number of the inspecting objects, but also the inspecting order, that is, the order in which the inspecting objects are inspected. Where the result of the electric-component mounting operations is inspected by using the imaging device, as described above, the mounted electric components are inspected by moving the imaging device and the circuit substrate relative to each other, between the mounted electric components, so that the time required for the inspecting operation increases with an increase in the length of a path of the relative movement of the imaging device. Accordingly, the inspecting operation can be completed in a time as short as possible, by determining the inspecting order so as to minimize the length of the movement path through the inspecting objects in the form of the electric components. In the present mode of the invention in which the inspecting order is determined so as to complete the inspecting operation in a minimum length of time, the inspecting operation can be effected efficiently.

(14) A substrate-worling-result inspecting apparatus according to any one of the above modes (1)(13), wherein the operating-procedure determining portion determines the operating procedure of said inspecting operation, further on the basis of historical information relating to the substrate working operations, and wherein the inspection control device includes a historical-information updating portion for updating the historical information. The historical information described above, particularly, the historical information relating to the operating device is desirably updated each time the inspecting operation is performed, from the standpoint that the historical information indicates the present state of the substrate working apparatus. In the present mode of the invention in which the historical information is updated, the inspecting operation can be effected with high reliability. Specific modes of the invention regarding the updating of the historical information will be described below.

(15) A substrate-working-result inspecting apparatus according to the above mode (14), wherein the historical-information updating portion updates the historical information on the basis of the substrate working information. The above-indicated device-usage historical information, etc. can be updated on the basis of the substrate working information. For instance, the number of operations of each suction nozzle, the number of components supplied from each tape feeder, etc. can be updated on the basis of the used-device information which relates to the number of mounting operations of each suction nozzle to mount the electric components and the number of supplying operations of each tape feeder to supply the electric components.

(16) A substrate-working-result inspecting apparatus according to the above mode (14) or (15), wherein the historical-information updating portion updates the historical information on the basis of inspecting-result information relating to the inspection operation performed by the inspecting device.

The above-indicated device-defect historical information, etc. can be updated on the basis of the inspecting-result information. For instance, the defect ratio of each suction nozzle can be updated on the basis of two kinds of information, that is, the inspecting-result information and the used-device information.

(17) A substrate-working-result inspecting apparatus according to any one of the above modes (I)(16), wherein the operating-procedure determining portion determines the operating procedure of said inspecting operation, on the basis of the substrate working information correlated with substrate-identifier information which identifies the circuit substrate. Where the operating procedure of the inspecting operation is determined for each circuit substrate, the substrate-identifier information identifying the circuit substrate is correlated with the substrate working information, so that the substrate-working information on the substrate working operations on each circuit substrate can be exactly recognized during the inspecting operation on that circuit substrate. Where the substrate working apparatus and the inspecting apparatus are disposed in a line, the substrate working information for the circuit substrate under inspection can be transmitted and received with high reliability between the substrate working apparatus and the inspecting apparatus, even if the order in which the circuit substrates are subjected to the working operations is different from the order in which the circuit substrates are subjected to the inspecting operations.

(18) A substrate-working-result inspecting apparatus according to the above mode (17), which is arranged to perform the inspecting operation on a circuit substrate which is provided with a substrate identifier identifying the circuit substrate, the substrate-working-result inspecting apparatus further comprising a substrate-identifier-information obtaining device for recognizing the substrate identifier and obtaining the substrate-identifier information of the circuit substrate. To correlate the substrate-identifier information and the substrate working information with each other, the substrate identifier on the circuit substrate is recognized to obtain the substrate-identifier information. The substrate identifier may be a substrate D mark in the form of a bar code provided on the surface of the circuit substrate, for example. This substrate D mark may be recognized by a reader exclusively provided to read the mark. As described above, the inspecting operation is usually effected by using an imaging device and an image data processing device. These imaging device and image data processing device may be used to obtain the substrate-identifier information. In this instance, the inspecting apparatus is not required to include an exclusive substrate-identifier recognizing device, and can be simplified. The substrate working operations are usually performed on the circuit substrate while the circuit substrate is held substantially at a predetermined position. In this case, substrate-hold-position information accurately indicating the hold-position of the circuit substrate is obtained, and the inspecting operation is performed on the basis of the obtained substrate-hold-position information. In most cases, the substrate-hold-position information is obtained by processing image data obtained by imaging substrate-position fiducial marks (fiducial marks) provided on the surface of the circuit substrate. These imaging device and image data processing device can be used to image the substrate ID mark.

(19) A substrate-working-result inspecting apparatus according to any one of the above modes (I)-(18), which is arranged to inspect a result of the substrate working operations performed by at least one substrate working apparatus, and disposed downstream of the at least one substrate working apparatus such that the substrate-working-result inspecting apparatus and the at least one substrate working apparatus are arranged in a line.

The inspecting apparatus according to the present invention may be disposed independently of the at least one substrate working apparatus, or such that the present inspecting apparatus and the at least one substrate working apparatus are arranged in a line, as in the present mode of the invention, and constitute a part of an electric-circuit fabricating system. Where the inspecting apparatus is incorporated in the line, the operating procedure of the inspecting operation is determined according to the fabricating tact of the line, so that the result of the working operations performed by each substrate working apparatus can be efficiently inspected,

(20) A substrate-working-result inspecting apparatus according to any one of the above modes (1)–(18), which is arranged to inspect a result of the substrate working operations performed by at least one substrate working aparatus, and is arranged as an integral part of one of the at least one substrate working apparatus on which the substrate working operations are performed last.

The substrate-working-result inspecting apparatus according to the present invention may be separate from any substrate working apparatus. That is, each substrate working apparatus is a stand-alone substrate working machine, while the present substrate-working-result inspecting apparatus is also a stand-alone substrate-working result inspecting machine, so that those stand-along working machine and inspecting machines are mutually independent fabricating machines. Alternatively, the substrate-working-result inspecting apparatus may be an integral part of one of the at least one substrate working apparatus, as in the present mode of the invention. For example, the present substrate-working-result inspecting apparatus is incorporated in the substrate working machine. Where the inspecting apparatus is part of the substrate working apparatus, the inspecting operation is usually performed as an ancillary operation of the substrate working apparatus, so that the inspecting operation is required to be performed in a short time. In this case, the inspecting objects and the order of inspection of the inspecting objects are selected and determined so as to efficiently perform the inspecting operation in a short time. While the several forms of the substrate-working-result inspecting apparatus have been described above, there will be described some common aspects of those forms of the inspecting apparatus. The inspection control device may be partly or entirely separate from the substrate working apparatus. Where the substrate working apparatus and the inspecting apparatus are disposed in a line, a system control device may be provided to control the entirety of an electric-circuit fabricating system; for example. In this case, the above-described operating-procedure determining portion, historical-information updating portion, etc. are incorporated in the system control device. Where a control device is provided in the substrate working apparatus, for example, the above-described operating-procedure determining portion, historical-information updating portion, etc. are provide in this control device. Namely, the inspecting apparatus of the present invention is interpreted to include such arrangements. In these arrangements, the inspection control device includes a part of the system control device or the control device provided to control the substrate working apparatus.

The present inspecting apparatus may be adapted to directly receive from the substrate working apparatus the substrate working information such as the above-described used-device information, working-failure-object information and re-worked-object information. Where the system control device is provided, the inspecting apparatus may be adapted to receive the substrate working information through the system control device, or receive information which is obtained by processing of the substrate working information by the system control device. Further, the historical information such as the above-described device-defect historical information and the device-usage historical information may be stored in the substrate working apparatus. In this case, the operating procedure of the inspecting operation to inspect a result of substrate working operations performed by another substrate working apparatus can be easily and conveniently determined on the historical information relating to that substrate working apparatus, where the inspection of this substrate working apparatus is required upon a change of the fabricating line.

(31) A substrate-working-result inspecting method of inspecting a result of substrate working operations performed on a circuit substrate, comprising:
    an operating-procedure determining step of determining an operating procedure of an inspecting operation to be performed on the circuit substrate, on the basis of substrate working information of the substrate working operations performed on the circuit substrate; and
    an inspecting step of performing the inspecting operation of the circuit substrate, according to the determined operating procedure.

(41) A substrate-working-result inspecting program executed by a computer, to inspect a result of substrate working operations performed on a circuit substrate, comprising:
    an operating-procedure determining step of determining an operating procedure of an inspecting operation to be performed on the circuit substrate, on the basis of substrate working information of the substrate working operations performed on the circuit substrate; and
    an inspecting step of controlling an inspecting apparatus provided to perform the inspecting operation, according to the determined operating procedure.

(51) A recording medium in which a substrate-working-result inspecting program as defined with respect to the mode (41) is stored such that said program is readable by a computer.

The above-indicated mode (31) relates to a method of inspecting a result of substrate working operations performed on a circuit substrate, which method permits highly efficient inspecting operation. For instance, the method of the mode (31) may be practiced by an inspecting apparatus as described with respect to the above-described mode (1), to perform the inspecting operation. The mode (41) relates to a program for performing such inspecting operation. For instance, the program of the mode (41) may be used to control the inspecting apparatus as described with respect to the above-described mode (1). Further, the mode (51) relates to a recording medium for storing the program, such as memories like ROM and RAM, and CD-ROM and floppy discs. The inspecting method, program and recording medium according to the above-described three modes may be reduced to practice, with the (7 addition of the technical features described in any one of the above modes (2)-(20). In these cases, the above three modes provide additional advantages corresponding to the respective technical features.

(61) An electric-circuit fabricating system including at least one substrate working apparatus for performing predetermined substrate working operations on a circuit substrate, and a substrate-working-result inspecting apparatus for inspecting a result of the substrate working operations performed by the at least one substrate working apparatus, the substrate-working-result inspecting apparatus comprising:
    an inspecting device for performing an inspecting operation; and
    an inspection control device provided with (a) an operating-procedure determining portion for determining an operating procedure of the inspecting operation to be performed on the circuit substrate, on the basis of substrate working information of the substrate working operations performed on the circuit substrate by the at least one substrate working apparatus, and (b) an operation control portion for controlling the inspecting device according to the determined operating procedure.

(62) An electric-circuit fabricating system according to the above mode (61), wherein the substrate-working-result inspecting apparatus is disposed downstream of the at least one substrate working apparatus such that the substrate-working-result inspecting apparatus and the at least one substrate working apparatus are arranged in a line.

(63) An electric-circuit fabricating system according to the above mode.(61), wherein the substrate-working-result inspecting apparatus is constructed as an integral part of one of the above-described at least one substrate working apparatus on which the substrate working operations are performed last.

The above-indicated mode (61) relates to an electric-circuit fabricating system including a substrate working apparatus, and a substrate-working-result inspecting apparatus of the above described mode (1) for inspecting a result of substrate working operations performed by the substrate working apparatus. In this fabricating system, the inspecting apparatus is capable of performing the inspecting operation with high efficiency. The mode (62) relates to a specific form of the fabricating system in which the substrate working apparatus and the inspecting apparatus are arranged in a line, while the mode (63) relates to a specific form of the fabricating system in which ihe substrate working apparatus and the inspecting apparatus are constructed integrally with each other, for example, the inspecting apparatus is incorporated in the substrate working apparatus. The fabricating systems according to the above-described three modes may be reduced to practice, with the addition of the technical features described in any one of the above modes (2)-(18). In these cases, the above three modes provide additional advantages corresponding to the respective technical features.

(71) An electric-circuit fabricating method including a substrate working step of performing predetermined substrate working operations on a circuit substrate, and a substrate-working-result inspecting step of inspecting a result of the substrate working operations, the substrate-working-result inspecting step comprising:

an operating-procedure determining step of determining an operating procedure of an inspecting operation to be performed on the circuit substrate, on the basis of substrate working information of the substrate working operations performed on the circuit substrate in the substrate working step; and an inspecting step of performing the inspecting operation of the circuit substrate, according to the determined operating procedure.

(81) An electric-circuit fabricating program executed by a computer, to perform substrate working operations, and inspect a result of the substrate working operations, comprising:

a substrate-working step of operating at least one substrate working apparatus to perform predetermined substrate working operations on a circuit substrate, and a substrate-working-result inspecting step of operating a substrate-working-result inspecting apparatus to inspect a result of the substrate working operations on the circuit substrate, and wherein the substrate-working-result inspecting step comprises:

an operating-procedure determining step of determining an operating procedure of an inspecting operation to be performed on the circuit substrate, on the basis of substrate working information of the substrate working operations performed on the circuit substrate by the at least one substrate working apparatus; and an inspecting step of performing the inspecting operation of the circuit substrate, according to the determined operating procedure.

(91) A recording medium in which an electric-circuit fabricating program as defined in the above mode (81) is stored such that the program is readable by a computer.

The above-indicated mode (71) relates to an electric-circuit fabricating method including a substrate-working-result inspecting method of inspecting a result of substrate working operations on the basis of information of the substrate working operations. According to this fabricating method, the inspecting method permits the inspecting operation with high efficiency. For instance, the method of the mode (71) may be practiced by a fabricating system as described with respect to the above-described mode (61), to fabricate an electric circuit. The mode (81) relates to a program for performing such inspecting operation. For instance, the program of the mode (81) may be used to control the electric-circuit fabricating system as described with respect to the above-described mode (61). Further, the mode (91) relates to a recording medium for storing this program, such as memories like ROM and RAM, and CD-ROM and floppy discs. The electric-circuit fabricating method, program and recording medium according to the above-described three modes may be reduced to practice, with the addition of the technical features described in any one of the above modes (2}(20). In these cases, the above three modes provide additional advantages corresponding to the respective technical features.

BRIEF DESCRIPTION OF THE DRAWINGS

FIG. 13 is a flow chart illustrating a mounted-component inspecting operation performed by the mounting-result inspecting machine;

FIG. 14 is a flow chart illustrating an inspecting procedure determining routine in the mounting-result inspecting operation;

DETAILED DESCRIPTION OF PREFERRED EMBODIMENTS

Figure 1:
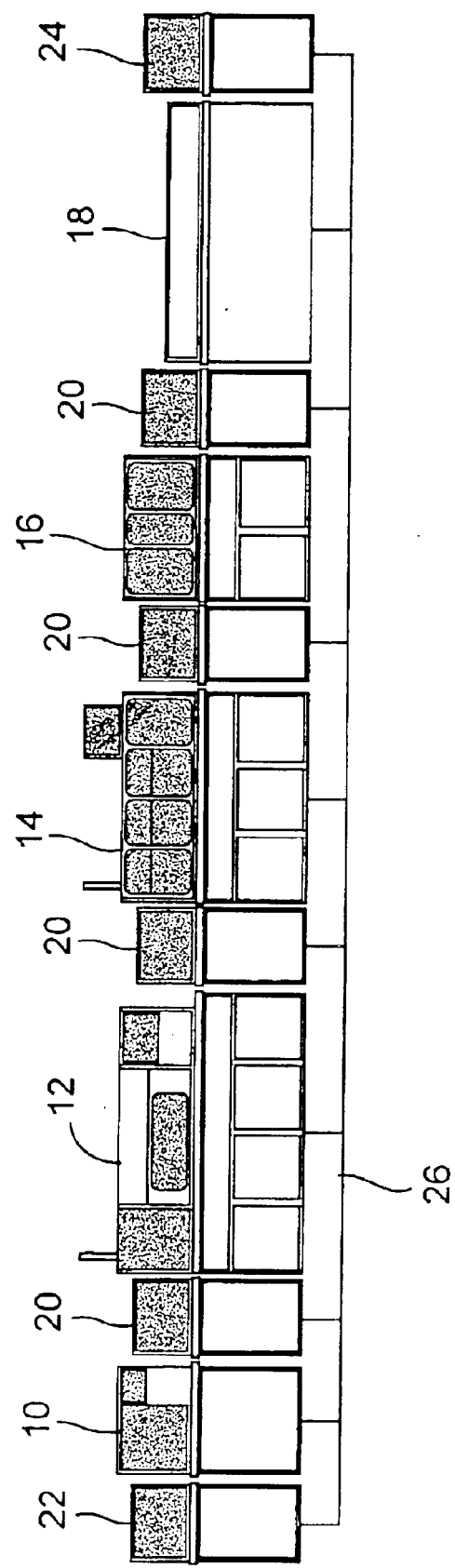
FIG. 1 is a view showing an electronic-circuit fabricating system arranged in a line.

There will be described in detail one embodiment of this invention and a modified form thereof, referring to the drawings. It is to be understood, however, that the present invention is not limited to the following embodiment, but the present invention may be embodied with various changes and improvements, such as those described in the SUMMARY OF THE INVENTION, which may occur to those skilled in the art: General arrangement of electric-circuit fabricating system>In FIG. 1, there is schematically shown an electric-circuit fabricating system arranged in a line. The present electric-circuit fabricating system includes a plurality of substrate working apparatuses operable to perform predetermined working operations on circuit substrates, namely, circuit-substrate working operations. Those substrate working apparatuses are operable independently of each other and arranged in a line. The substrate working apparatuses include a solder applying machine 10 provided a solder applying device arranged to apply by printing a creamy solder or a solder paste to the circuit substrate, a first and a second component-mounting machine 12, 14 provided as electric-component mounting apparatuses arranged to mount electronic components on the circuit substrate, a mounting-result inspecting machine 16 provided as a mounting-operation inspecting apparatus arranged to inspect results of the mounting operations performed by the first mounting machine 12 and the second mounting machine, and a re-flow machine 18 provided as a re-flow furnace arranged to solder the electronic components mounted on the circuit substrate. These apparatuses 10, 12, 14, 16 and 18 are arranged in the order of description, in a direction from the upstream side toward the downstream side of the system. Between the adjacent ones of the substrate working machines, there are interposed substrate transferring machines 20 provided as substrate transferring devices connecting the adjacent substrate working machines. Further, a substrate loading machine 22 is disposed on the upstream side of the solder applying machine 10, as a substrate loading device (loader) arranged to load the circuit substrates into the present system, and a substrate unloading device 24 is disposed on the downstream side of the re-flow machine 18, as a substrate unloading device (unloader) arranged to unload the circuit substrates from the present system. Those substrate working machines are connected to each other through a communication cable 26 for transmission and reception of information relating to the working operations, to and from each other.

The first component-mounting machine 12 disposed on the upstream side is a component-mounting apparatus of rotary head type having a mounting unit which carries a plurality of mounting heads and which is intermittently rotated. The second component-mounting machine 14 disposed on the downstreae side is a component-mounting apparatus of XY robot type wherein a mounting unit is moved in a plane parallel to the circuit substrate. For example, the first component-mounting machine 12 is assigned to mount electronic components of comparatively small sizes, while the second component-mounting machine 14 is assigned to mount electronic components of comparatively large sizes or unusual configurations, so that these two machines cooperate to mount the required electronic components on each circuit substrate. The mounted-component inspecting machine 16 disposed downstream of those component-mounting machines 12, 14 is an inspecting apparatus of XY robot type wherein an imaging device operable to take an image of a surface of the circuit substrate is moved in a plane parallel to the circuit substrate. In the present embodiment, a procedure of inspection by the mounted-component inspecting machine 16 is determined on the basis of mounting operation information which relates to the substrate working operations performed by the two component-mounting machines 12, 14. In the present embodiment, the component-mounting machines 12, 14 are provided as the substrate working apparatuses, while the mounted-component inspecting machine 16 is provided as a substrate-working-result inspecting apparatus. Further, the electronic-component mounting operations performed by the component-mounting machine 12 and the component-mounting machine 14 are circuit-substrate working operations in the present invention, while the inspecting operation performed by the mounting-result inspecting machine 16 is a substrate-worcing-result inspecting operation in the present invention.

<Arrangement of first component mounting apparatus>

Figure 2:
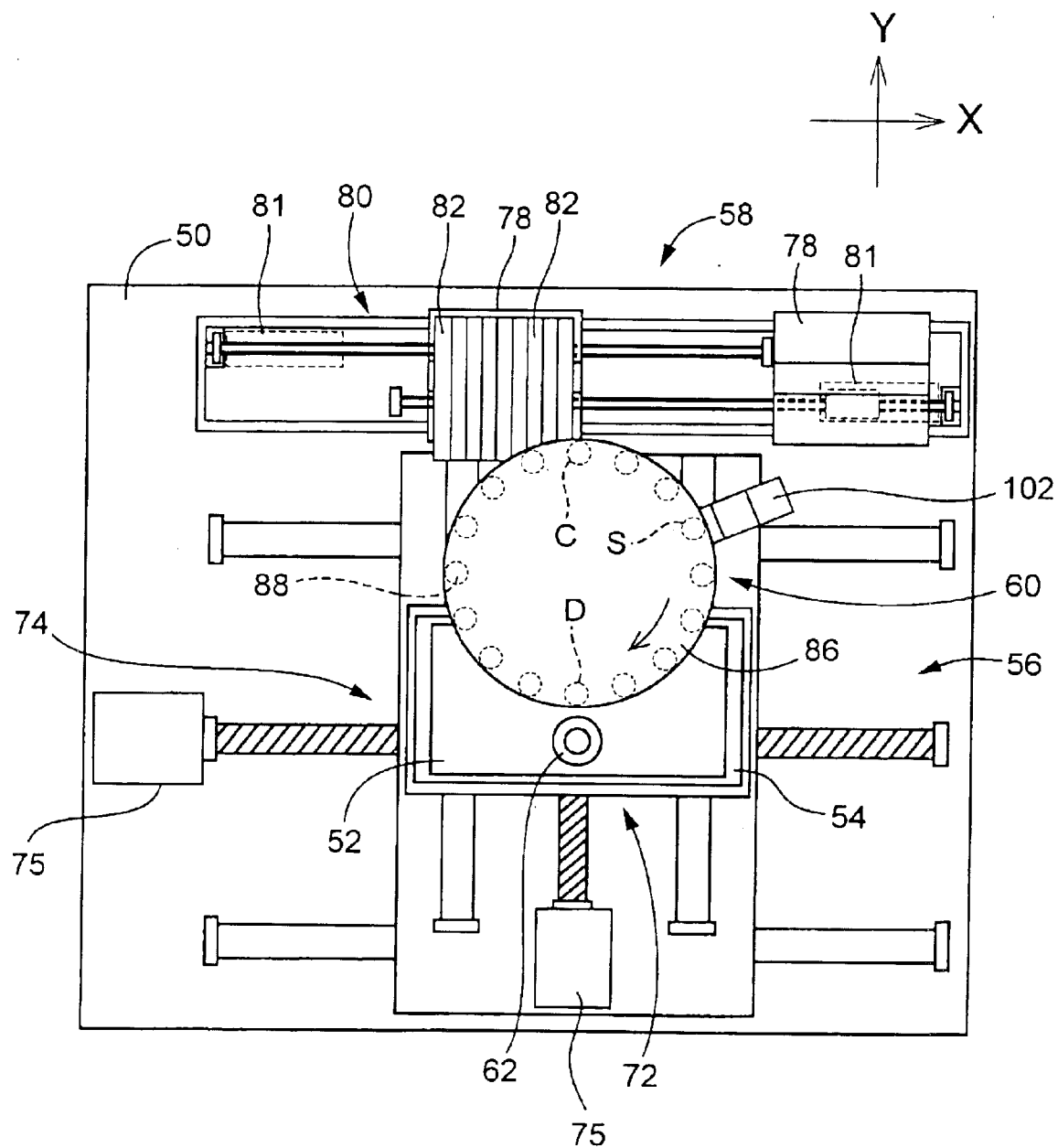
FIG. 2 is a plan view schematically illustrating a first component-mounting machine (component-mounting machine of rotary head type)
Figure 3:
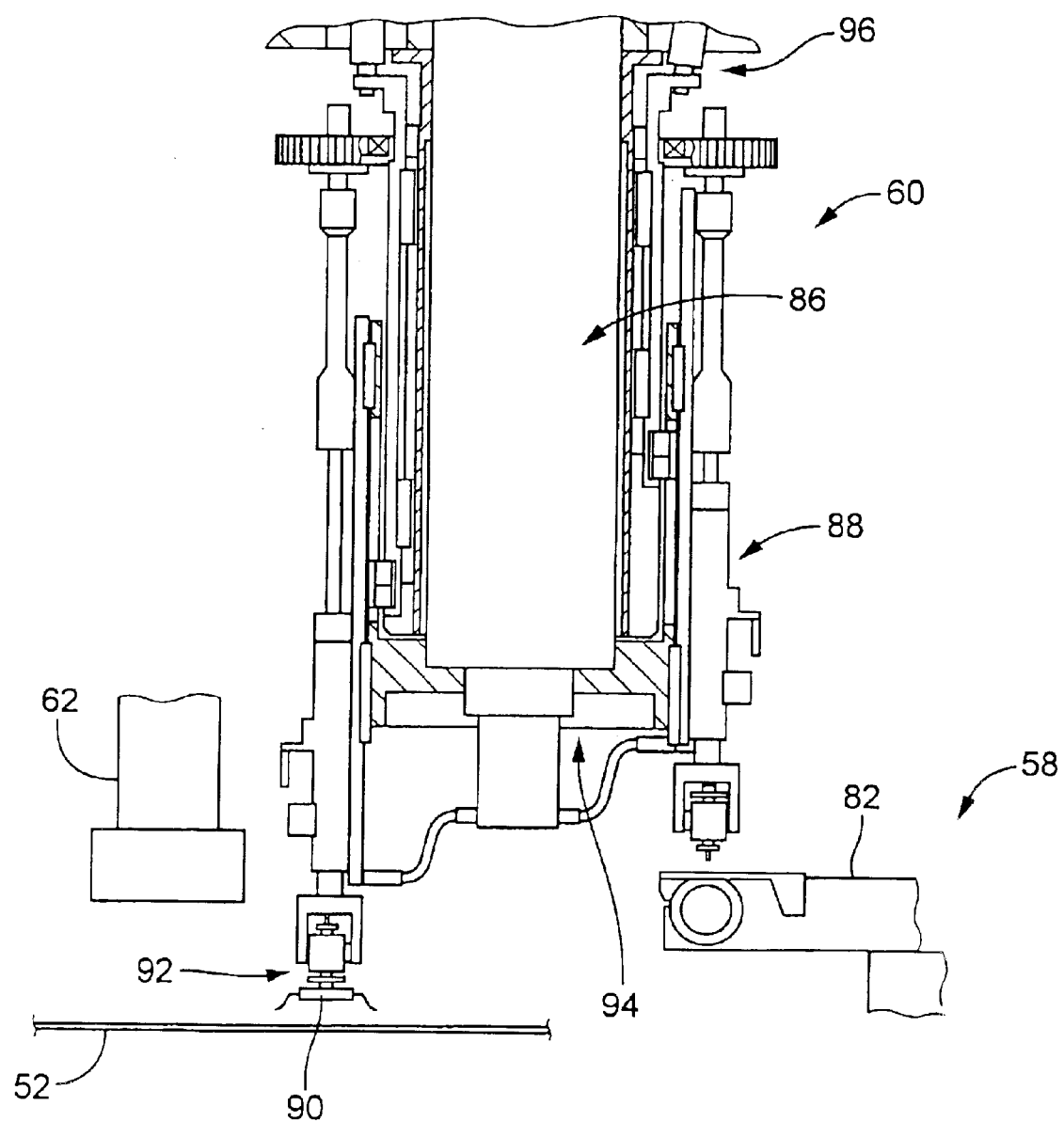
FIG. 3 is a side elevational view partly in cross section showing primarily a mounting unit of the first component-mounting machine.

The plan view of FIG. 2 schematically illustrates the first component-mounting machine 12, while the side elevational view of FIG. 3 partly in cross section shows primarily a mounting unit of the first component-mounting machine 12. The first component-mounting machine 12 includes: a machine body 50; a substrate holding device 54 disposed on the machine base 50, for holding a circuit substrate 52; an XY table device 56 disposed on the machine body 50, for moving the substrate holding device 54 in an X-axis direction and a Y-axis direction; a component-supplying device 58 disposed on a portion of the machine base 50 on the rear side (upper side as seen in FIG. 1) of the XY table device 56; a mounting unit 60 disposed on a portion of the machine base 50 which is located above the substrate holding device 54 and the component-supplying device 58, for mounting the electronic components; a substrate imaging device 62 disposed in front of the mounting unit 60, operable to image the surface (mounting surface) of the circuit substrate 52, and including a CCD camera as an image-taking device; and a mounting control device 64 (FIG. 4) for controlling those devices (hereinafter collectively referred to as "mounting-operation devices"). The present component-mounting machine 12 is substantially identical in construction with a component-mounting machine as disclosed in Japanese Patent Application No. 2001-172915 (not published yet) filed by the assignee of the present application and the corresponding co-pending U.S. patent application Ser. No. 10/159,008. The mounting unit 60 is substantially identical in construction with a mounting unit as disclosed in JP-A-6-342998, JP-A-2001-345599 and Publication US 2001-0047586-A1 of the corresponding U.S. Patent Application, while the component-supplying device 58 is substantially identical in construction with a component-supplying device as disclosed in JP-B2-8-21791.

The substrate-holding device 54 is arranged to hold the circuit substrate 52 substantially at a predetermined position during a component mounting operation, and is connected to two substrate conveyors (not shown) connected to the respective upstream and downstream substrate transferring machines 20. The XY table device 56 consists of a Y-table device 72 arranged to support the substrate holding device 54 and move the substrate holding device 54 in the Y-axis direction, and an X-table device 74 arranged to support the Y-table device 72 and move the Y-table device 72 in the X-axis direction. Each of the Y-table device 72 and the X-table device 74 includes a drive source in the form of a servomotor 75, a ballscrew mechanism, etc. The component-supplying device 58 includes, as major elements, two component-supply tables 78, a component-supply-table moving device 80 (including a drive source in the form of a servomotor 81, a ballscrew mechanism, etc.) arranged to move those component-supply tables 78 independently of each other in the X-axis direction, and a plurality of tape feeders 82 (a kind of parts feeders) disposed on the component-supply tables 78 (tape feeders 82 on one of the component-supply tables are not shown) and capable of feeding carrier tapes which hold successions of electronic components. The component-supply device 58 is controlled such that the electronic components are supplied at a predetermined component-supply position in a predetermined order of mounting the electronic components. That is, one of the tape feeders 82 which holds the electronic component to be mounted is moved to a position right below a component-sucking station (indicated at C in FIG. 2) of the mounting unit 60. The carrier tape is fed by that tape feeder 82 so that the electronic component 90 at a component-supply portion of the tape feeder can be held by suction by a suction nozzle 92 which will be described. This series of operations is repeated for each of the electronic components to be mounted one after another.

The mounting unit 60 includes, as major elements, a mounting unit body 86, and a plurality of mounting heads 88 (16 mounting heads 88 in this embodiment) which are disposed along a peripheral portion of the mounting unit 86 such that the axis of each mounting head 88 is perpendicular to the circuit substrate 52. Each mounting head 88 has the suction nozzle 92 for holding the electronic component 90 at its lower end. The suction nozzle 92 is connected to a negative-pressure source not shown, for holding the electronic component 90 by suction under a negative pressure. The mounting heads 88 are held at respective positions on the mounting unit 86, which are equiangularly spaced apart from each other in the circumferential direction of the mounting unit body 86. The mounting unit body 86 has a mounting-head turning device 94 operable to intermittently turn the mounting heads 88 about the axis of the mounting unit body 86, so that each mounting head 88 is intermittently moved along a circular path including the component-sucking station C and a component-mounting station D, which are indicated in FIG. 2. The mounting unit body 86 also has a mounting-head elevating and lowering device 96 and a mounting-head rotating device 98 (shown in FIG. 4), so that each mounting head 88 is vertically movable at the component-supplying station C and the component-mounting station D, and is rotatable about its axis as needed. With the operations of the above-indicated devices, the mounting heads 88 hold the electronic components 90 by suction at the component-sucking station C, and mount the electronic components 90 on the surface of the circuit substrate 52, at the component-mounting station D.

Along the path of movement of the mounting heads 88, there is also provided a component-imaging station S at which a component-imaging device 102 (using a CCD camera) for taking an image of the electronic component 90 held by the suction nozzle 92, as viewed in the upward direction. Image data obtained by the component-imaging device 102 are processed by an image processing device in the form of a component-image processing unit 104 (shown in FIG. 4 and included in the mounting control device 64), to obtain component-hold-position information relating to the position of the electronic component 90 as held by the suction nozzle 92. The substrate imaging device 62 is fixed in position, and a desired portion of the surface of the circuit substrate 52 can be imaged by the substrate imaging device 62, by movements of the circuit substrate 52 by the XY table device 56. Image data obtained by the substrate imaging device 62 are processed by an image processing device in the form of a substrate-image processing unit 106 (shown in FIG. 4 and included in the mounting control device 64), to obtain substrate-hold-position information relating to a positioning error of the circuit substrate 52 held by the substrate holding device 54.

Figure 4:
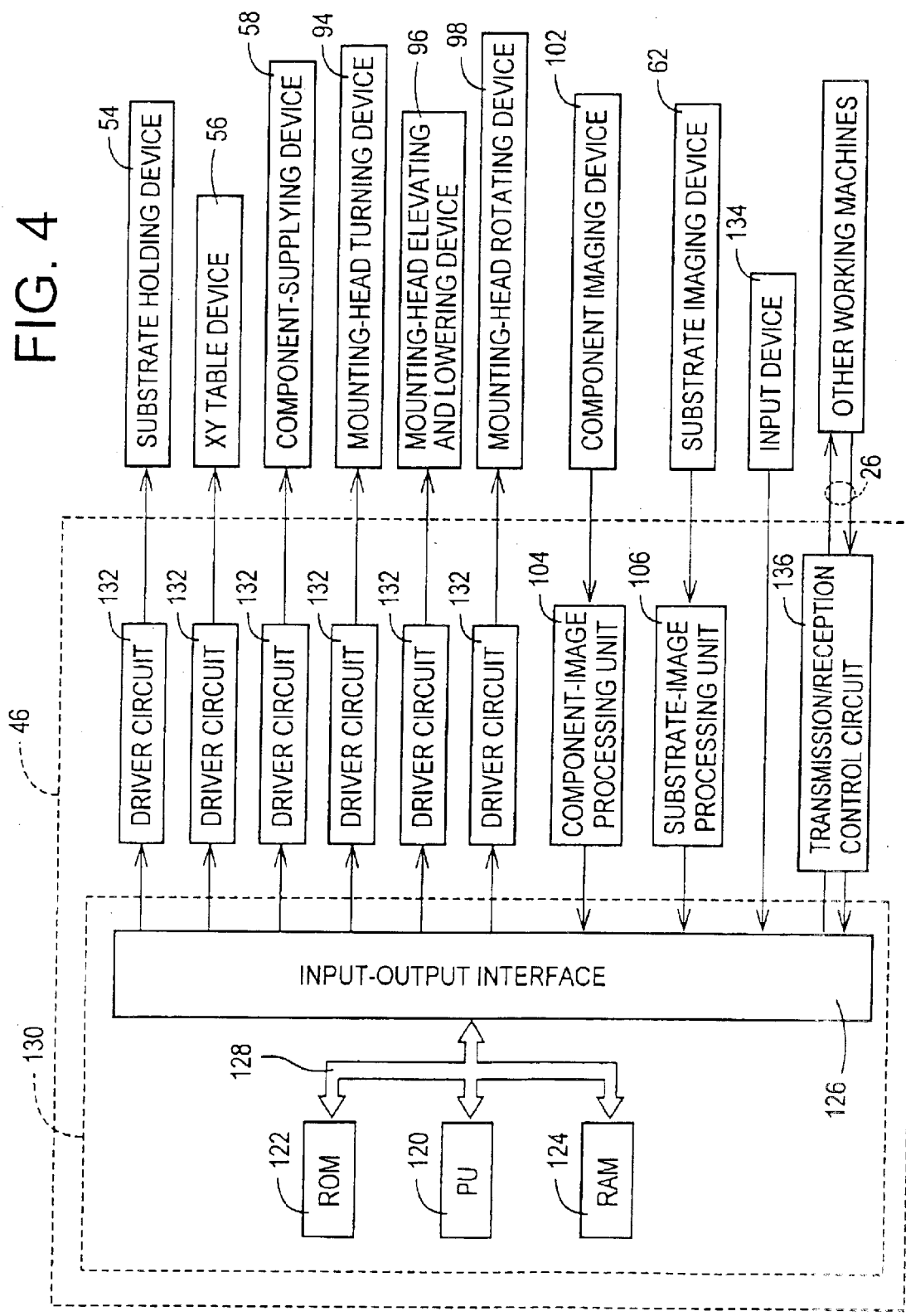
FIG. 4 is a block diagram showing a mounting control device for controlling the first component-mounting machine, and some elements of this machine which relate to the present invention.

The block diagram of FIG. 4 shows the mounting control device 64 for controlling the component-mounting apparatus in the form of the first component-mounting machine 12 described above, and some elements of this machine which relate to the present invention. The mounting control device 64 is principally constituted by a computer 130 incorporating a PU 120, a ROM 122, a RAM 124, an input-output interface 126, and a bus 128 interconnecting those elements. To the input-output interface 126, there are connected through respective driver circuits 132 provided within the mounting control device 64, the substrate holding device 54, the XY table device 56, component-supplying device 58, the mounting-head turning device 94, the mounting-head elevating and lowering device 96, and the mounting-head rotating device 98. To the input-output interface 126, there are also connected the component imaging device 102 and the substrate imaging device 62 through the component-image processing unit 104 and the substrate-image processing unit 106, respectively, to obtain the component-hold-position information and the substrate-hold-position information, as described above. Also connected to the input-output interface 126 are an input device 134 and a transmission/reception control circuit 136. The input device 134 is principally constituted by a keyboard for controlling the first component-mounting machine 12. To the transmission/reception control circuit 136, there is connected the communication line 26 for transmission and reception of various kinds of information to and from the other working machines. The ROM 122 stores programs such as a basic operation control program for the first component-mounting machine 12, while the RAM 124 stores electronic-component mounting control programs corresponding to the respective circuit substrates on which the mounting operations are to be performed, and further stores mounting-object information (indicative of mounting spots and angle of the individual electronic components), and other information such as the above-indicated component-hold-position information and substrate-hold-position information. The mounting operation of the present component-mounting machine is substantially identical with that disclosed in JP-B2-8-21791, and will not be described herein.

<Arrangement of Second Component-Mounting Machine>

Figure 5:
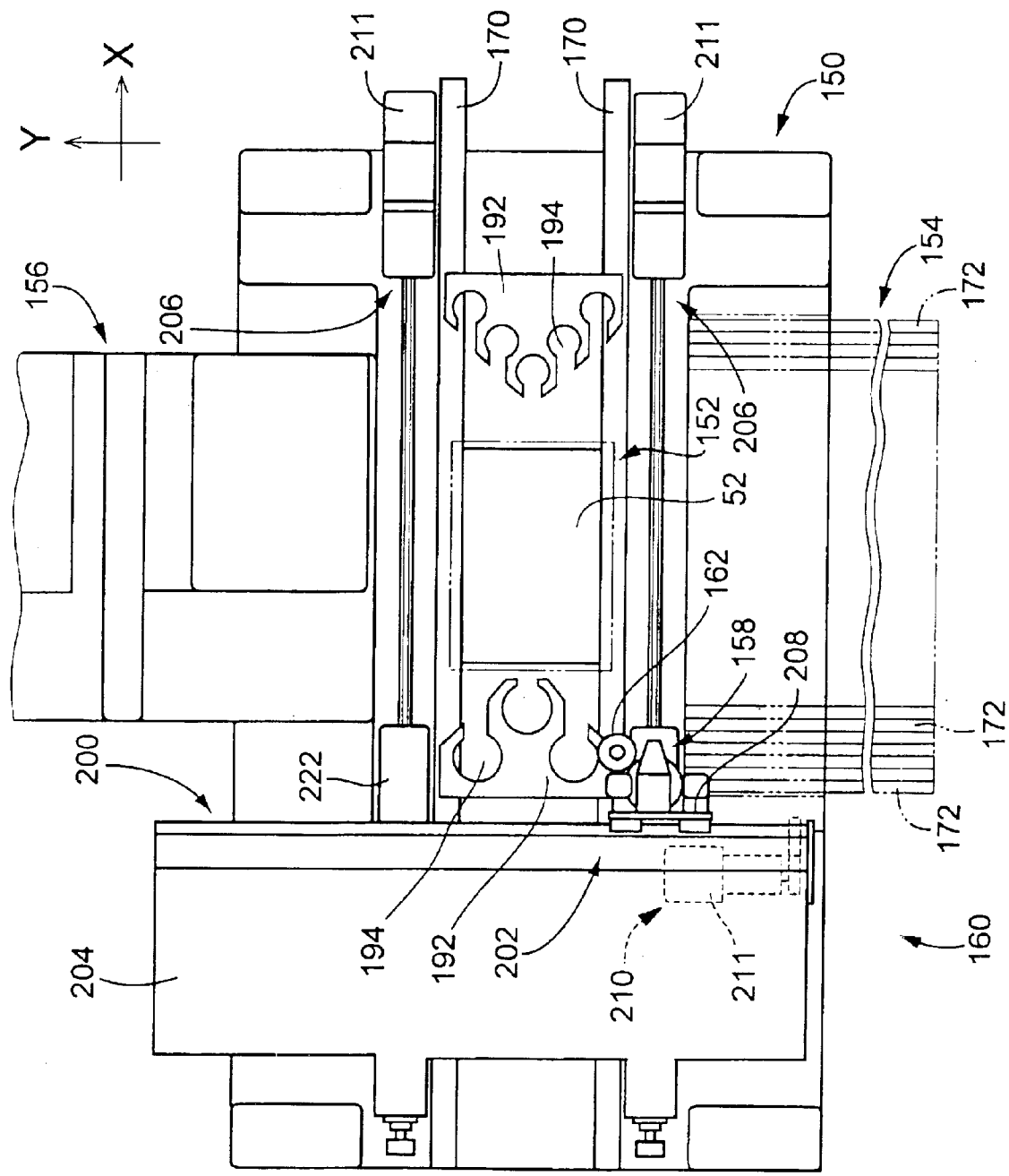
FIG. 5 is a plan view schematically showing a second component-mounting machine (component-mounting machine of XY robot type)
Figure 6:
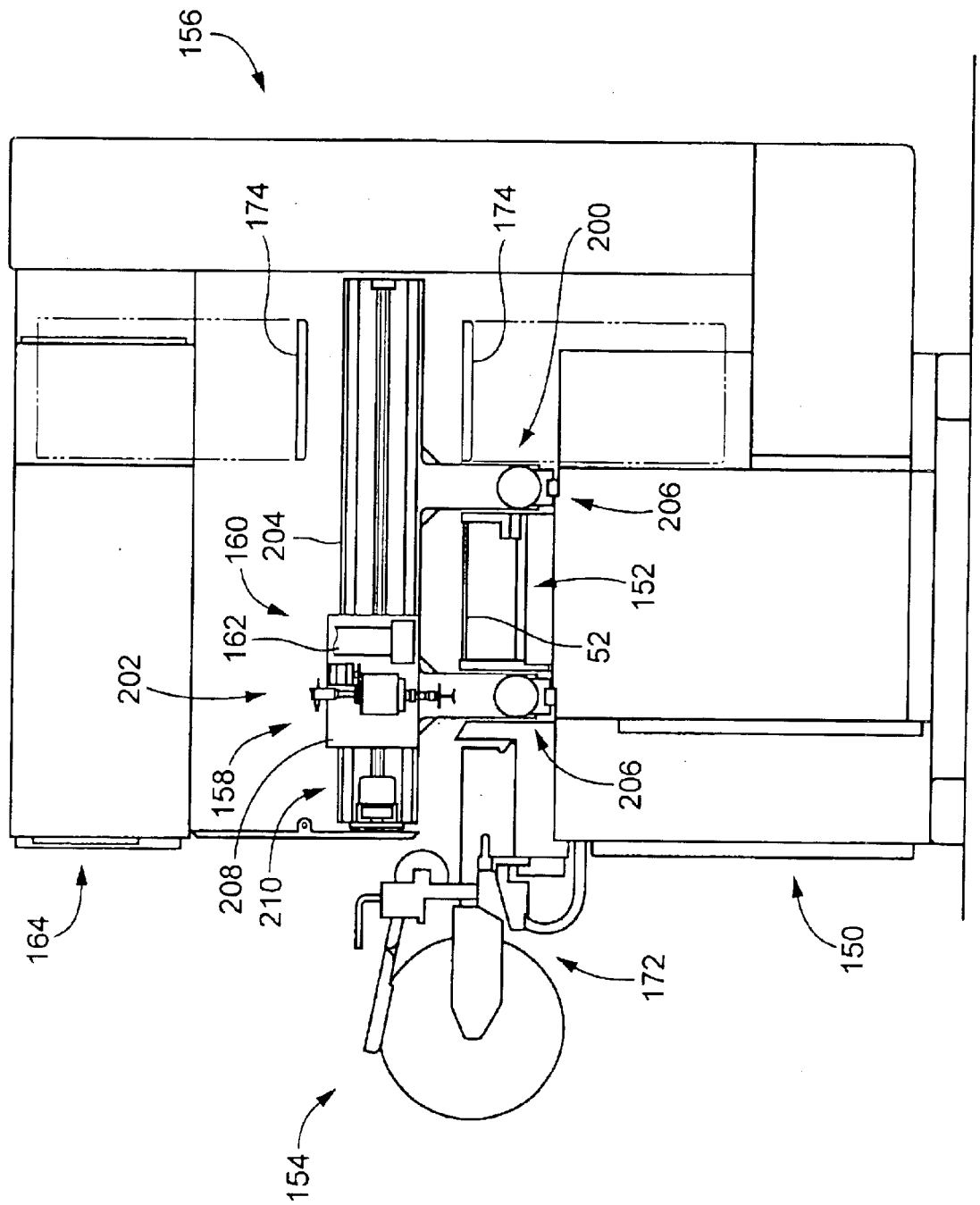
FIG. 6 is a side elevational view schematically illustrating the second component-mounting machine.
Figure 7:
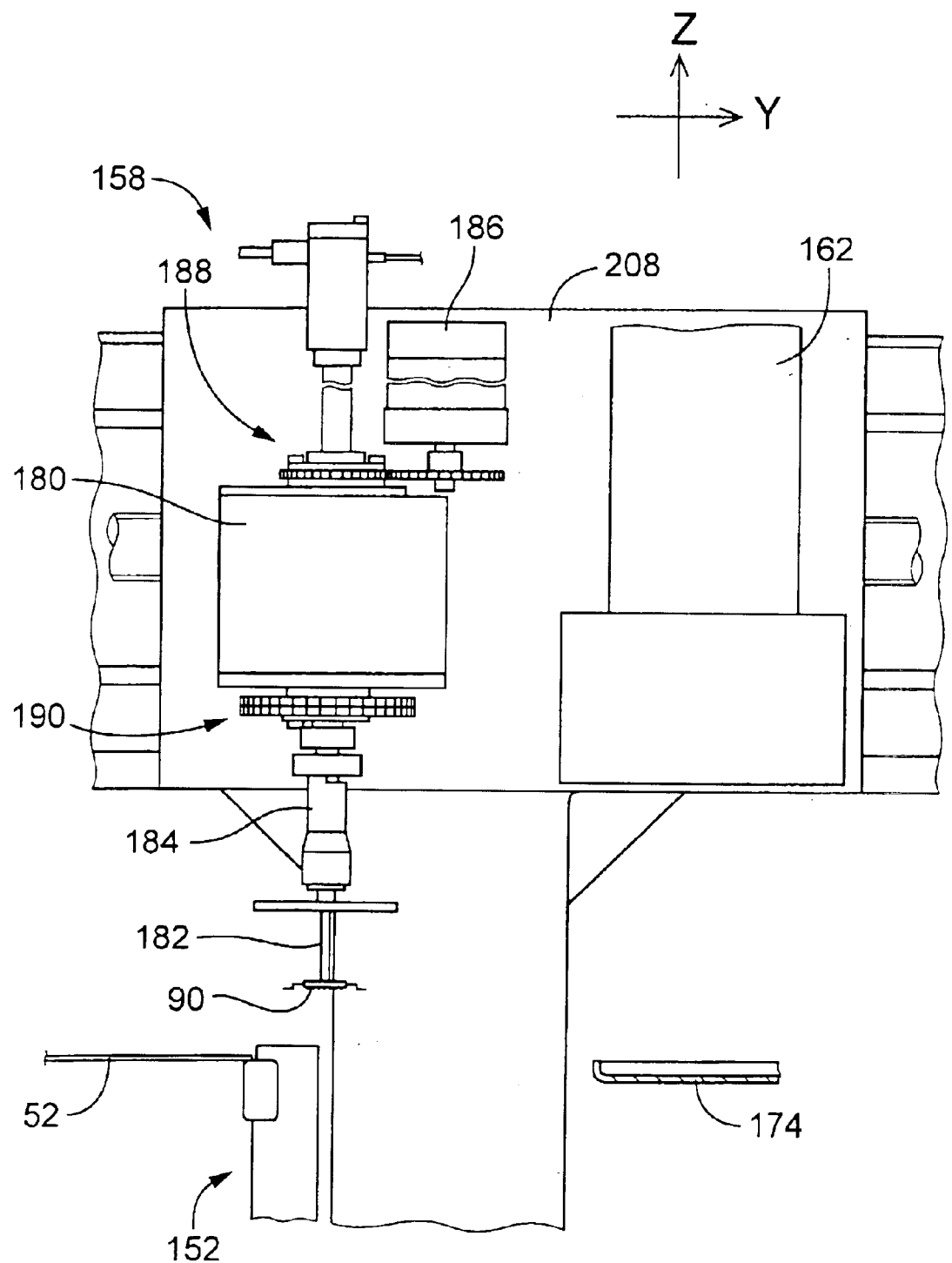
FIG. 7 is a view showing a mounting unit of the second component-mounting machine, and its vicinity.

The plan view of FIG. 5 and the side elevational view of FIG. 6 schematically show the second component-mounting machine 14, and FIG. 7 shows the mounting unit and its vicinity. The second component-mounting machine 14 is constituted principally by: a machine base 150; a substrate holding device 152 disposed on the machine base, to hold the circuit substrate 52; a feeder type component-supplying device 154 disposed on the front side (lower side as seen in FIG. 5) of the substrate holding device 152; a tray type component-supplying device 156 disposed on the rear side (upper side as seen in FIG. 5) of the substrate holding device 152; a mounting unit 158 movable in a space above the two component-supplying devices 154, 156 and the substrate holding device 152, in a plane parallel to the circuit substrate 52, for mounting the electronic components on the circuit substrate 52; an XY robot device 160 disposed on the machine base 150, for moving the mounting unit 158 as described above; a substrate imaging device 162 which is moved by the XY robot device 160, together with the mounting unit 158, and including a CCD camera capable of imaging the surface (mounting surface) of the circuit substrate 52; and a mounting control device 164 (shown in FIG. 8) for controlling those devices (hereinafter collectively referred to as "mounting-operation devices"). The present component-mounting machine is substantially identical in construction with a component-mounting machine as disclosed in Japanese Patent No. 2824378, and the tray type component-supplying device 156 is substantially identical in construction with JP-B2-2-57719, while the mounting unit 158 is substantially identical in construction with a mounting unit as disclosed in Japanese Patent No. 3093339.

The substrate holding device 152 is arranged to hold the circuit substrate 52 transferred by a substrate conveyor 170, substantially at a predetermined position for mounting the electronic components. The feeder type component-supplying device 154 has a plurality of tape feeders 172 arranged on a stationary component supply table in the X-axis direction (in the right and left direction as seen in FIG. 5). Each of the tape feeders 172 is arranged to feed a carrier tape holding a succession of electronic components. Each one of the tape feeders 12 is arranged to supply the electronic components 90 of the same kind. The tray type component-supply device 156 has a plurality of trays 174 superposed in a stack such that each tray 174 accommodates a plurality of electronic components. The trays 174 are successively moved so that the mounting unit 158 can receive the electronic components from each tray 174.

The mounting unit 158 includes, as major elements, a mounting unit body 180, a mounting head 184 rotatably and vertically movably disposed on the mounting unit body 180, a mounting-head elevating and lowering device 188 having a drive source in the form of an electric motor 186 and operable to vertically move the mounting head 184, and a mounting-head rotating device 190 having a drive source in the form of an electric motor (not shown) and operable to rotate the mounting head 184 about its axis. The mounting head 184 has a suction nozzle 182 removably attached thereto and arranged to hold the electronic component 90 by suction at its lower end. The mounting head 184 is vertically moved by the mounting-head elevating and lowering device 188 to hold the electronic component 90 by suction and mount the electronic component 90 on the surface of the circuit substrate 52, when the mounting head 184 is located at the component-supplying position and the component-mounting position, respectively. Depending upon the angular position of the electronic component as held by the mounting head 184, the mounting head 184 is rotated about its axis to eliminate an angular positioning error of the electronic component. The suction nozzle 182 is connected to a negative-pressure source not shown, to hold the electronic component by suction under a negative pressure. Two nozzle storage devices 192 for storing the suction nozzles 182 are disposed on the opposite sides of the substrate holding device 152 and are spaced apart from each other in the X-axis direction. In the present component-mounting machine 14, the nozzle storage devices 192 have a total of eight nozzle receptacles 194 for storing respective eight suction nozzles 182 (not shown in FIG. 5). When the mounting unit 158 is located above one of the nozzle receptacles 194 of the nozzle storage device 192, the suction nozzle 182 presently mounted on the mounting head 184 can be replaced with the suction nozzle 182 accommodated in that nozzle receptacle 194.

The XY robot device 160 includes an X-robot device 200 and a Y-robot device 202. The X-robot device 200 is disposed on the machine base 150, and includes an X-axis slide 204, and an X-axis-slide moving device 206 for moving the X-axis slide 204 in the X-axis direction, while the Y-robot device 202 is disposed on the X-axis slide 204, and includes a Y-axis slide 208 and a Y-axis-slide moving device 210 for moving the Y-axis slide 208 in the Y-axis direction. Each of the X-robot device 200 and the Y-robot device 202 has a drive source in the form of a servomotor 211, and a baliscrew mechanism. The mounting unit 158 described above is disposed on the Y-axis slide 208.

Figure 8:
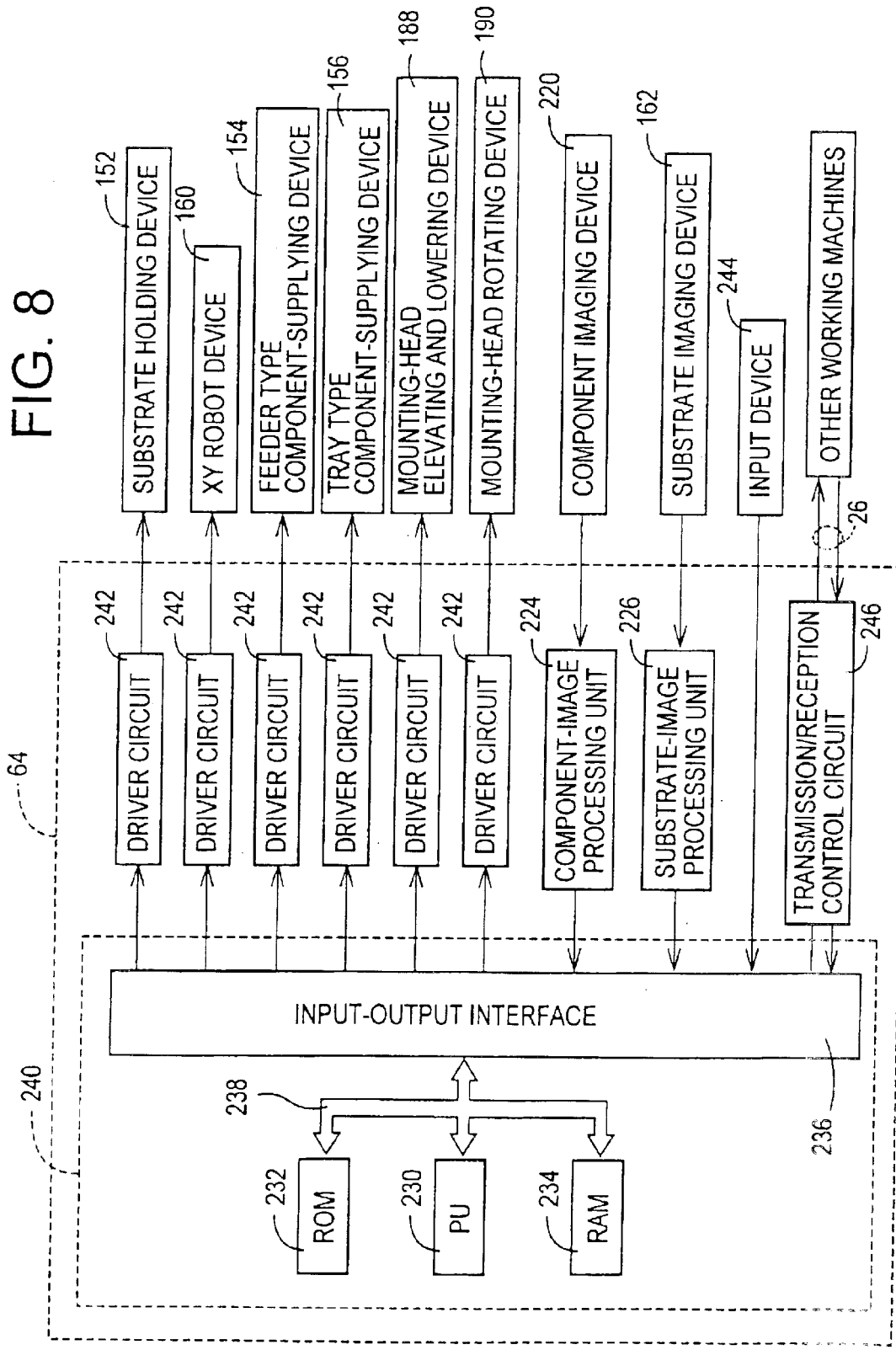
FIG. 8 is a block diagram showing a mounting-control device for controlling the second component-mounting machine, and some elements of this machine which relate to the present invention.

The Y-axis slide 204 is provided with a component imaging device 220 (shown in FIG. 8: only a reflecting mirror 222 of its light guiding device is shown in FIG. 5). The component imaging device 220 includes a CCD camera. When the mounting head 184 passes a position right above the reflecting mirror 222, the component imaging device 220 takes an image of the electronic component 90 as held by the mounting head 184. Image data obtained by the component imaging device 220 are processed by an image processing device in the form of a component-image processing unit 224 (shown in FIG. 8 and included in the mounting control device 164), to obtain component-hold-position information of the electronic component 90. The substrate imaging device 162 is disposed on the Y-axis slide 208, moved by the XY robot device 160, and capable of imaging a desired portion of the surface of the circuit substrate 52. Image data obtained by the substrate imaging device 162 are processed by an image processing device in the form of a substrate-image processing unit 226 (shown in FIG. 8 and included in the mounting control device 164), to obtain substrate-hold-position information of the circuit substrate 52.

The block diagram of FIG. 8 shows the mounting control device 164 for controlling the component-mounting device in the form of the second component-mounting machine 14 described above, and some elements of this machine which relate to the present invention. The mounting control device 164 is principally constituted by a computer 240 incorporating a PU 230, a ROM 232, a RAM 234, an input-output interface 236, and a bus 238 interconnecting those elements. To the input-output interface 236, there are connected through respective driver circuits 242 provided within the mounting control device 164, the substrate holding device 152, the XY robot device 156, feeder type component-supplying device 154, the tray type component-supplying device 156, the mounting-head elevating and lowering device 188, and the mounting-head rotating device 190. To the input-output interface 236, there are also connected the component imaging device 220 and the substrate imaging device 162 through the component-image processing unit 224 and the substrate-image processing unit 226, respectively, to obtain the component-hold-position information and the substrate-hold-position information, as described above. Also connected to the input-output interface 236 are an input device 244 and a transmission/reception control circuit 246. The input device 244 is principally constituted by a keyboard for controlling the second component-mounting machine 14. To the transmission/reception control circuit 246, there is connected the communication line 26 for transmission and reception of various kinds of information to and from the other working machines. The ROM 232 stores programs such as a basic operation control program for the second component-mounting machine 14, while the RAM 234 stores electronic-component mounting control programs corresponding to the respective circuit substrates on which the mounting operations are to be performed, and further stores mounting-object information, and other information such as the above-indicated component-hold-position information and substrate-hold-position information. The mounting operation of the present component-mounting machine is substantially identical with that disclosed in Japanese Patent No. 2824378 and JP-A-2001-223500, and will not be described herein.

<Arrangement of mounting-result inspecting machine>

Figure 9:
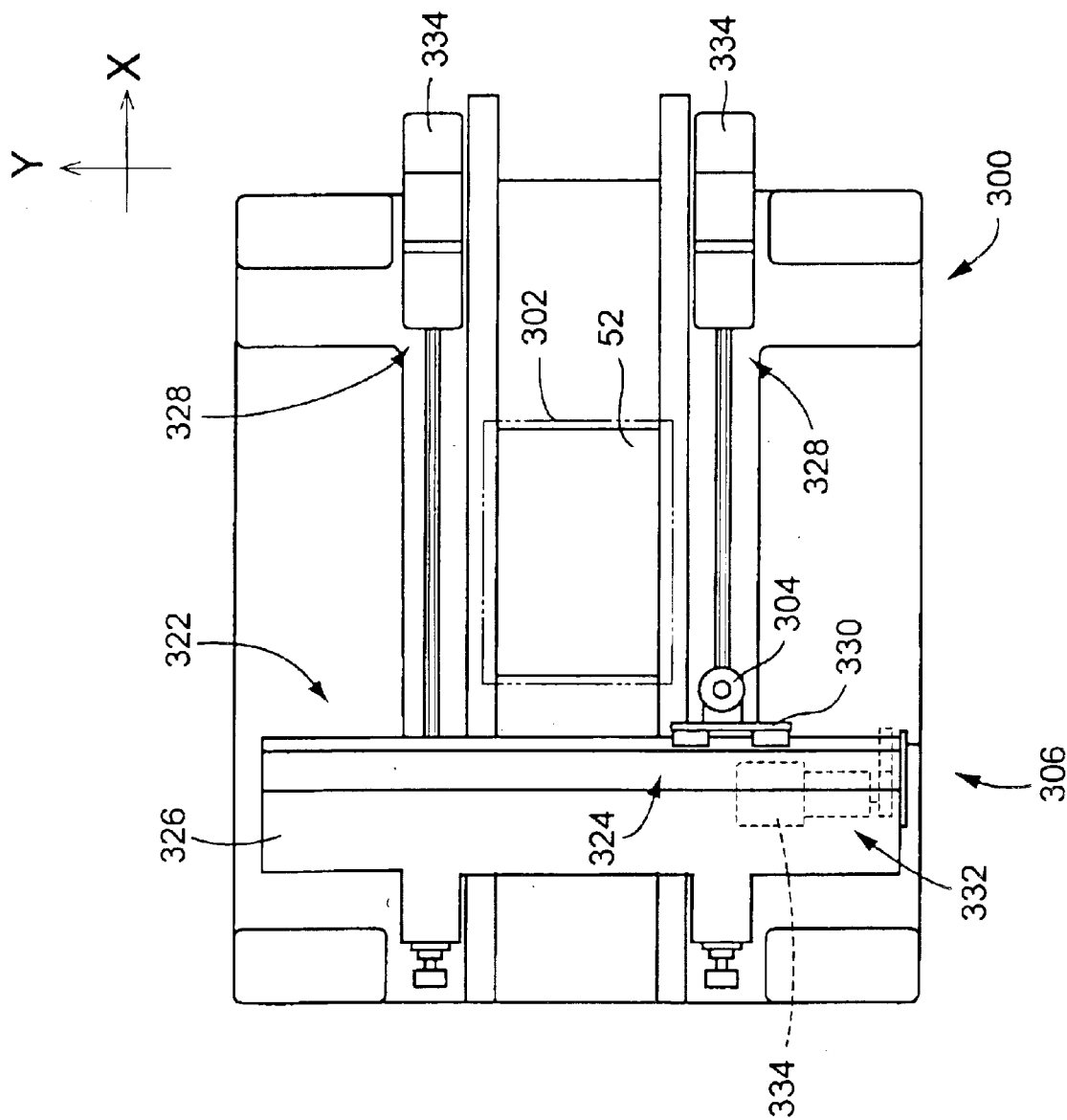
FIG. 9 is a plan view schematically illustrating a mounting-result inspecting machine.

The plan view of FIG. 9 schematically shows the mounting-result inspecting machine 16. Roughly speaking, this inspecting machine 16 is the same as the second component-mounting machine 14 described above, except for the elimination of the mounting unit 158 and the two component-supplying devices 154, 156 provided to mount the electronic components. The inspecting machine 16 includes, as major elements, a machine base 300, a substrate holding device 302 disposed on the machine base 300, for holding the circuit substrate 52, a substrate imaging device 304 including a CCD camera and capable of imaging the surface (mounting surface) of the circuit substrate 52, an XY robot device 306 for moving the substrate imaging device 304 in a space above the substrate holding device 152, in a plane parallel to the circuit substrate 52, and an inspection control device 308 (shown in FIG. 10) for controlling those devices (hereinafter collectively referred to as "inspection-operation devices").

The substrate holding device 152 is substantially the same as that of the second component-mounting machine 14, and is arranged to hold the circuit substrate 52 transferred by a substrate conveyor 320, substantially at a predetermined position for inspecting the electronic components. The XY robot device 306 is substantially identical with that of the second component-mounting machine 14, and includes an X-robot device 322 and a Y-robot device 324. The X-robot device 322 is disposed on the machine base 300, and includes an X-axis slide 326, and an X-axis-slide moving device 328 for moving the X-axis slide 326 in the X-axis direction, while the Y-robot device 324 is disposed on the X-axis slide 322, and includes a Y-axis slide 330 and a Y-axis-slide moving device 332 for moving the Y-axis slide 330 in the Y-axis direction. Each of the X-robot device 322 and the Y-robot device 224 has a drive source in the form of a servomotor 334, and a ballscrew mechanism.

The substrate imaging device 304 is disposed on the Y-axis slide 330, moved by the XY robot device 306, and capable of imaging a desired portion of the surface of the circuit substrate 52. The substrate imaging device 304 takes images of the objects in the form of the mounted electronic components 90 and their vicinities, according to a predetermined inspecting procedure. Image data obtained by the substrate imaging device 304 are processed by an image processing device in the form of a substrate-image processing unit 336 (shown in FIG. 10 and included in the inspection control device 308), to obtain component-mounting-position error information relating to positioning errors of the objects in the form of the mounted electronic components.

Figure 10:
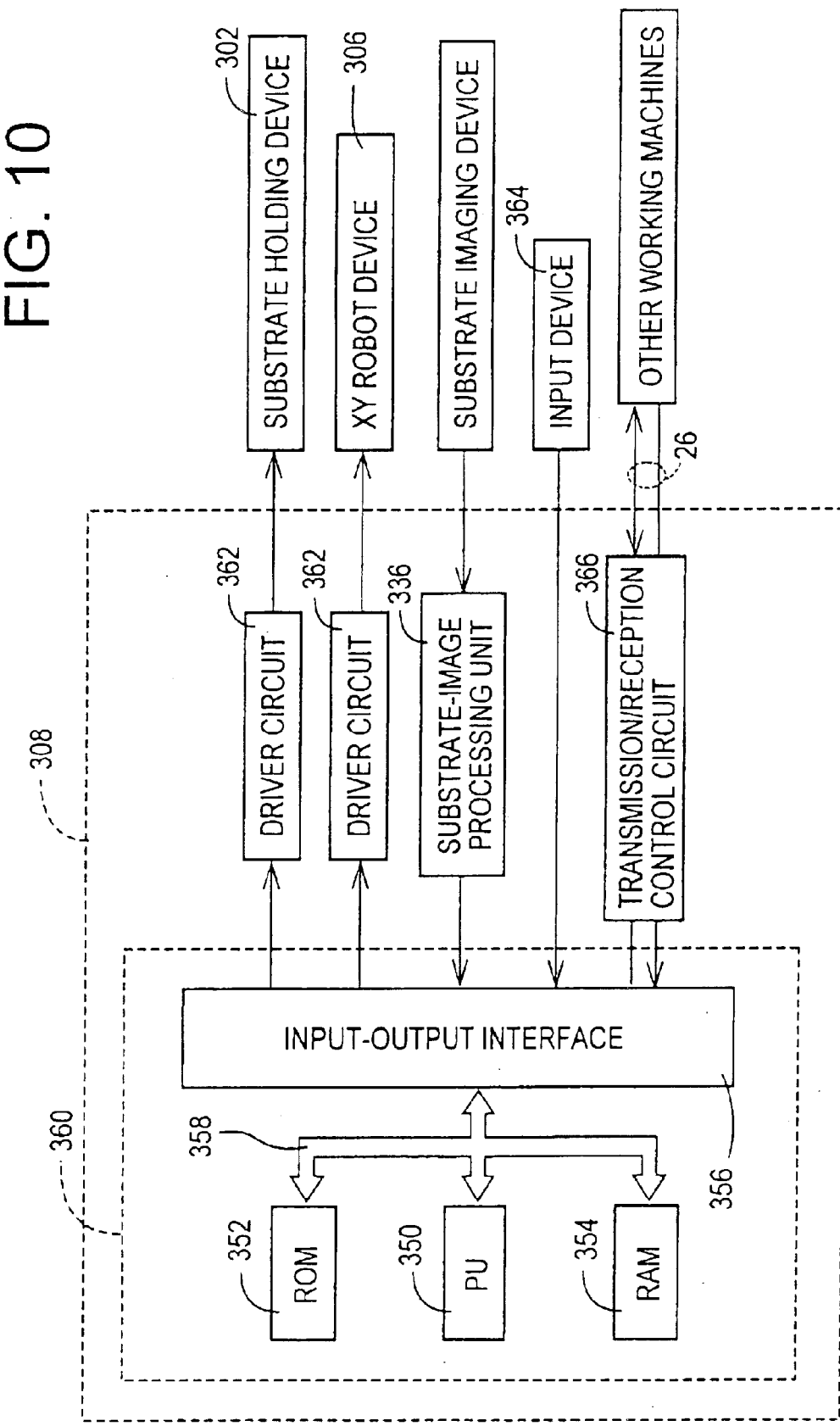
FIG. 10 is a block diagram showing an inspection control device for controlling the mounting-result inspecting machine, and some elements of this machine which relate to the present invention.

The block diagram of FIG. 10 shows the inspection control device 308 for controlling the inspecting device in the form of the mounting-result inspecting machine 16 described above, and some elements of this machine which relate to the present invention. The inspection control device 308 is principally constituted by a computer 360 incorporating a PU 350, a ROM 352, a RAM 354, an input-output interface 356, and a bus 358 interconnecting those elements. To the input-output interface 356, there are connected through respective driver circuits 362 provided within the inspection control device 308, the substrate holding device 302 and the XY robot device 306. To the input-output interface 356, there is also connected the substrate imaging device 304 through the substrate-image processing unit 336, to obtain the substrate-hold-position and the mounting-position error information of the mounted electronic components, as described above. Also connected to the input-output interface 356 is an input device 364 and a transmission/reception control circuit 366. The input device 364 is principally constituted by a keyboard for controlling the mounting-result inspecting machine 16. To the transmission/reception control circuit 366, there is connected the communication line 26 for transmission and reception of various kinds of information to and from the other working machines. The ROM 352 stores programs such as a basic operation control program for the mounting-result inspecting machine 16, and basic programs for determining the inspecting procedure. The RAM 234 stores mounting-object information corresponding to the respective circuit substrates on which the inspection is to be performed, substrate-hold-position information, operation historical information of the first and second component-mounting machines 12, 14, and an inspection control program for performing the inspection operation according to the determined inspection procedure.

<Circuit substrate, mounting-object information, etc.>

Figure 11:
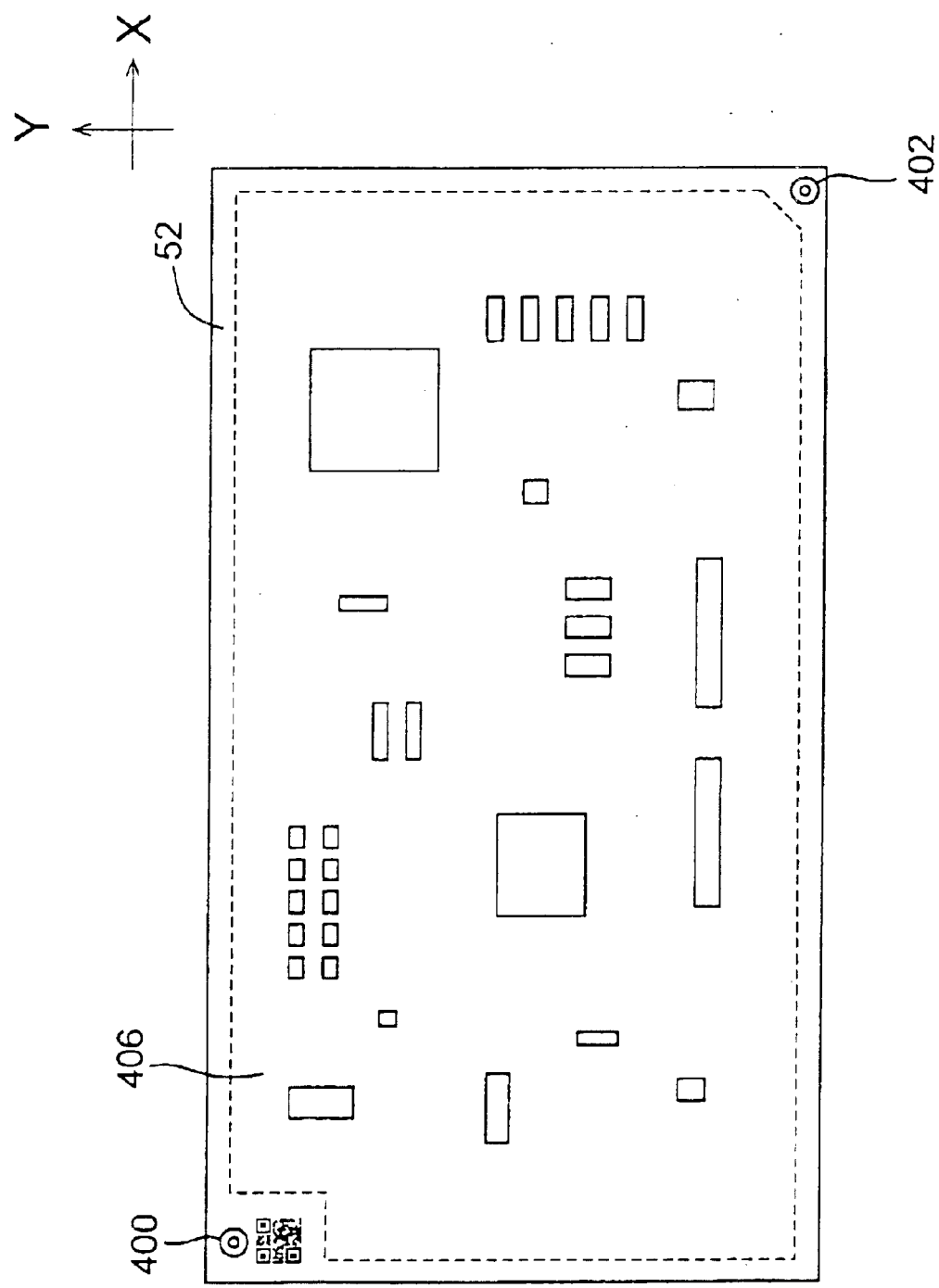
FIG. 11 is view schematically illustrating a circuit substrate used to fabricate an electric circuit.

FIG. 11 schematically illustrates the circuit substrate used to fabricate an electric circuit in the present embodiment. The circuit substrate 52 has two substrate-position fiducial marks 400, 402 provided in respective two diagonally opposed corner portions thereof. These corner portions function as a substrate fiducial portion. The substrate-position fiducial marks 400, 402 are utilized to obtain the above-indicated substrate-hold-position information relating to the positions of the circuit substrate 52 as held by the substrate holding devices 54, 152 and 302 of the first component-mounting machine 12, second component-mounting machine 12 and mounting-result inspecting machine 16, which have been described above. Described in detail, the substrate-position fiducial marks 400, 402 function as an indicator indicative of the fiducial position of the circuit substrate 52. Images of these two substrate-position fiducial marks 400, 402 are taken by the substrate imaging devices 62, 162, 304, and the thus obtained image data are processed by the image processing devices in the form of the substrate image processing units 106, 226, 336, to detect positioning errors of the circuit substrate 52, in the mutually perpendicular two directions (X-axis and Y-axis directions) in the plane parallel to the surface of the circuit substrate 52 and in the direction of rotation in that plane (hereinafter referred to as "θ-axis direction"). The component mounting and inspecting operations are performed on the basis of the thus detected positioning errors of the circuit substrate, so as to eliminate the positioning errors, to mount and inspect the individual electronic components 90.

The circuit substrate 52 has a substrate ID mark 404, which is disposed adjacent to one of the two substrate-position fiducial marks 400, 402, that is, the substrate-position fiducial mark 400, as a substrate identifier identifying the circuit substrate 52. This substrate ID mark 404 is a two-dimensional bar code, which is advantageous in that the area of the mark as the identifier per unit volume of information is comparatively small. Like the substrate-position fiducial marks 400, 402, the substrate ID mark 404 is imaged by the substrate imaging devices 62, 162, 304, and the thus obtained image data are processed by the substrate-image processing units 106, 226, 336, to obtain substrate-identifier information. That is, a substrate-identifier-information obtaining device is provided in each of the substrate working apparatuses, to obtain the substrate-identifier information. This substrate-identifier-information obtaining device includes the substrate imaging device 62, 162, 304 and the substrate-image processing unit 106, 226, 336. The substrate-position fiducial mark 400 and the substrate ID mark 404 are positioned relative to each other such that images of these two marks 400, 404 are located within the field of vision of each substrate imaging device 61, 162, 304, and such that these marks can be simultaneously imaged.

A multiplicity of electronic components 90 are mounted in an electronic-component mounting region 406 of the circuit substrate 52. Each of these electronic components 90 is an object to be handled by the first and second component-mounting machines 12, 14, namely, a mounting object. The information relating to the mounting object, that is, the mounting-object information indicates the mounting spot within the electronic-component mounting region 406, in which each electronic component is to be mounted, and also indicates the angle at which the electronic component is to be mounted in the mounting spot. A batch of mounting-object information exists for each of the component-mounting machines, and includes names of the electronic components, and mounting-position information such as an X-axis position (X0), a Y-axis position (Y0) and an angle (θ0) of each electronic component, as indicated below in TABLE 1. Described in more detail, the mounting-position information is a set of positional data within a nominal coordinate system having a predetermined zero point set on the circuit substrate, and consists of coordinate values of the center of each mounting object in the form of an electronic component 90 in the nominal coordinate system, and an angular position of that electronic component 90 in a plane parallel to the circuit substrate 52. In TABLE 1 given below, the coordinate values and the angular position are indicated in arbitrary unit (a.u.). As described above, the mounting-object information is stored in the RAM 124, 234 of each component-mounting machine, and is used as data for determining the inspection procedure in the inspecting operation, and data for obtaining the positioning errors of the mounting objects. The mounting-object information is also stored in the RAM 354 of the mounting-result inspecting machine 16.

TABLE 1

| Mounting object | Component name | Mounting-position Information | | |
|---|---|---|---|---|
| | | $X_0$ | $Y_0$ | $\theta_0$ |
| <First component-mounting machine> | | | | |
| A-001 | FG05689 | 235 | 25 | 90 |
| A-002 | FG05689 | 135 | 25 | 90 |
| A-003 | HY00356 | 30 | 155 | 0 |
| A-004 | FG47725 | 120 | 140 | 180 |
| A-005 | VR00047 | 445 | 75 | 0 |
| A-006 | VF01478 | 350 | 85 | 90 |
| A-007 | VD33325 | 380 | 55 | 0 |
| A-008 | VD33325 | 380 | 65 | 0 |
| A-009 | NN25554 | 325 | 110 | 270 |
| A-010 | KT14487 | 180 | 190 | 0 |
| A-011 | HH00023 | 65 | 50 | 180 |
| A-012 | HG47622 | 95 | 150 | 0 |
| ⋮ | ⋮ | ⋮ | ⋮ | ⋮ |
| <Second component-mounting machine> | | | | |
| B-001 | DK01255 | 119 | 180 | 0 |
| B-002 | BB58843 | 445 | 150 | 0 |
| B-003 | BB58843 | 425 | 150 | 0 |
| B-004 | GF00141 | 275 | 65 | 180 |
| B-005 | KU11137 | 325 | 190 | 270 |
| B-006 | NR22300 | 350 | 135 | 90 |
| B-007 | HD11447 | 80 | 30 | 0 |
| B-008 | HD11447 | 80 | 50 | 0 |
| B-009 | CS00055 | 225 | 140 | 90 |
| B-010 | ZA00007 | 130 | 90 | 0 |
| B-011 | GP22214 | 165 | 45 | 180 |
| ⋮ | ⋮ | ⋮ | ⋮ | ⋮ |

<First mounting operation and working information>

Figure 12:
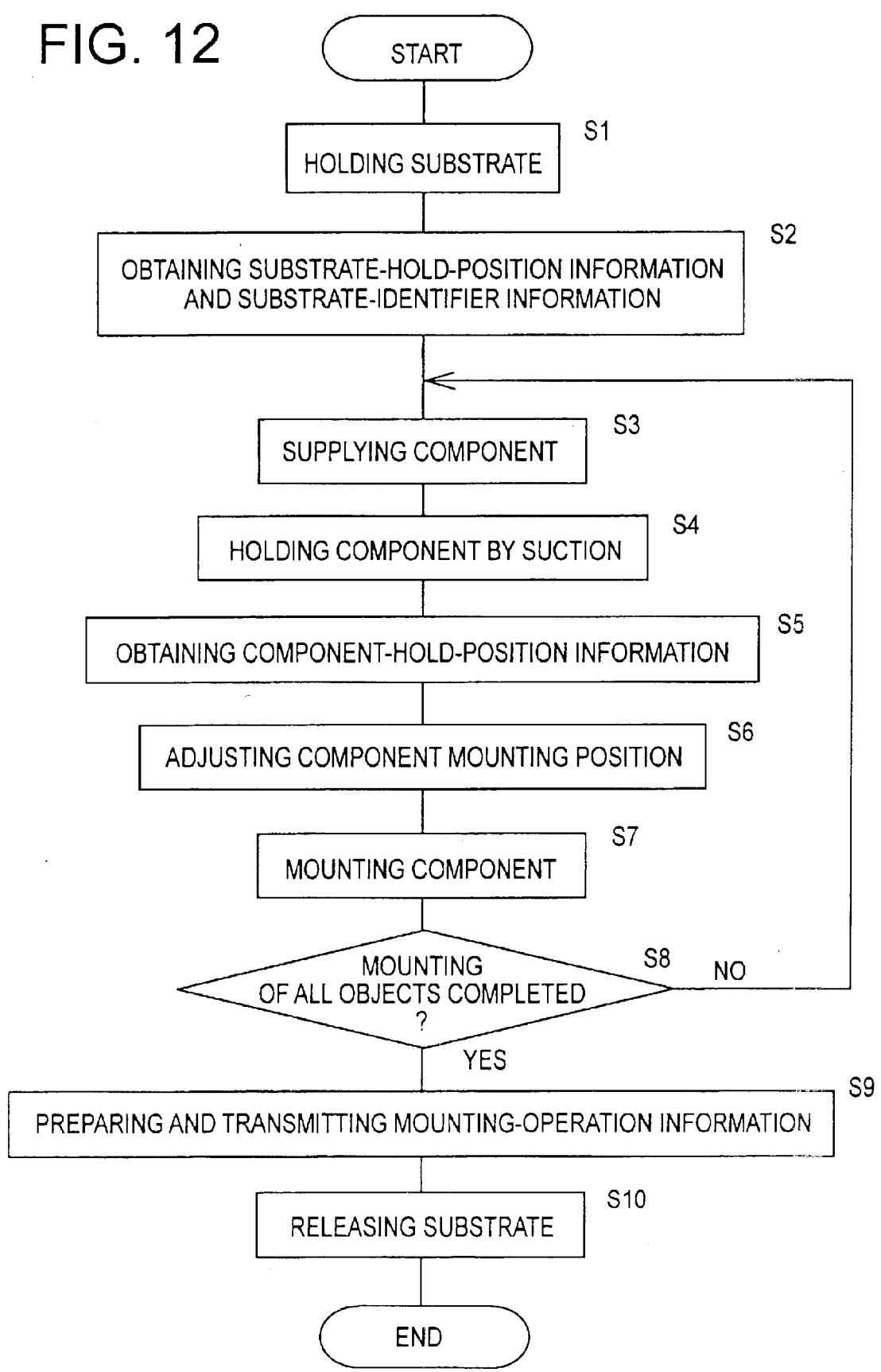
FIG. 12 is a flow chart illustrating an electric-component mounting operation.

The circuit substrate on which the solder paste has been printed by the solder applying device 10 is transferred onto the first component-mounting machine 12, and is subjected to a first electronic-component mounting operation (first component-mounting operation), which is one of substrate working operations. This first component-mounting operation is a mounting step, which is one of substrate working steps in the fabrication of the electric circuit. FIG. 12 is a flow chart illustrating the first component-mounting operation. The first component-mounting operation is performed by operating the mounting device of the first component-mounting machine 12 according to this flow chart. The mounting device of the first component-mounting machine 12 is controlled by the mounting control device 64, according to the basic operation control program stored in the ROM 122, and the electronic-component mounting control program corresponding to the circuit substrate in question, which is stored in the RAM 124. The RAM 124 also stores information relating to operating devices used for the electronic components 90 to be mounted, such as information indicative of the tape feeders 92 of the component-supplying device 58 which accommodate those electronic components 90, and information indicative of the suction nozzles 92 suitable for the electronic components. The above-indicated electronic-component mounting control program is considered to be a program for performing working operations on the mounting objects, in a predetenrined order on the basis of the information relating to those operating devices, and the mounting-object information described above.

The first mounting operation is initiated with step 1 (hereinafter abbreviated as "S1": other steps being similarly abbreviated) wherein the circuit substrate 52 which has been transferred by the upstream substrate transferring machine 20 is held by the substrate holding device 54, substantially at the predetermined position. This step is a substrate holding step.

Then, S2 is implemented to obtain the substrate-hold-position information and the substrate-identifier information. This step is a combination of a step of obtaining the substrate-identifier information and a step of obtaining the substrate-hold-position information. Initially, the substrate imaging device 62 is located above the one substrate-position fiducial mark 400, by movements of the circuit substrate 52 together with the substrate holding device 54 by the XY table device 56. Strictly speaking, the substrate imaging device 62 and the circuit substrate 52 are positioned relative to each other, such that both the substrate-position fiducial mark 400 and the substrate ID mark 404 disposed adjacent to this substrate-position fiducial mark 400 are located within the same imaging field of the substrate imaging device 62. At this relative position, the two marks 400, 404 and a portion of the surface of the circuit substrate around these marks are imaged. Then, image data obtained by this imaging operation are processed to obtain information on the position of the substrate-position fiducial mark 400 within the mechanical coordinate system of the first component-mounting machine 12. Further, the image data of the substrate ID mark are processed to obtain the substrate-identifier information of the held circuit substrate.

Then, the circuit substrate 52 is moved such that the substrate imaging device 62 is located above the other substrate-position fiducial mark 402. At this position, the substrate-position fiducial mark 402 and a portion of the surface of the circuit substrate around the fiducial mark 402 are imaged. Image data obtained by this imaging operation are processed to obtain information on the position of the substrate-position fiducial mark 402 within the above-indicated mechanical coordinate system.

Then, the thus obtained positional data of the two substrate-position fiducial marks 400, 402 are processed to calculate the hold-position of the circuit substrate 52, for obtaining the substrate-hold-position information. This substrate-hold-position information indicates actual positioning errors of the circuit substrate with respect to the predetermined nominal position at which the circuit substrate 52 is held. For instance, the substrate-hold-position information has a data format consisting of a positioning error $\Delta Xb1$ of the circuit substrate in the X-axis direction, a positioning error $\Delta Yb1$ of the circuit substrate in the Y-axis direction, and a positioning error $\theta b1$ of the circuit substrate in the $\theta$-axis direction (an angle of inclination of the circuit substrate in the plane parallel to the surface of the circuit substrate). The substrate-hold-position information is stored in the RAM 124, together with the substrate-identifier information. In addition, the mounting control device 64 establishes an operational coordinate system as distinguished from the above-indicated mechanical coordinate system, on the basis of the obtained positional data. Motions and working operations relating to the circuit substrate 52, which will be described, are commanded by specifying the positions as defined within this operational coordinate system.

S3 through S7 are actions of the component-mounting machine, more specifically, a series of steps for mounting each electronic component. First, component-supplying step S3 is implemented to move the component supply table 78 of the component-supplying device 58 so that the tape feeder 82 accommodating the first electronic component 90 to be mounted is located at the component-supply position. The information indicative of the tape feeders 78 from the electronic components 90 to be mounted have been supplied is stored in the RAM 124.

In the next component-sucking step S4, the mounting head 88 of the mounting unit 60 which is located at the component-supplying station C is operated to hold the electronic component 90 by suction. Before the electronic component is held by suction, one of the six suction nozzles 92 provided on that mounting head 88, which is suitable for the electronic component 90 in question, is selected and brought into its operable position (at a station downstream of the component-supplying station C). Information indicative of this selected suction nozzle 892 is stored in the RAM 124.

After the component-sucking step, the mounting unit body 86 is intermittently turned to turn the mounting head 88 holding the electric component 90, about the axis of the mounting unit body 86, until this mounting head 88 is located at the component-imaging station S, at which the component-hold-position information obtaining step S5 is implemented. In this component-hold-position information obtaining step, the electronic component 90 held by the mounting head 88 is imaged by the component imaging device 102, and image data obtained by this imaging operation are processed to obtain the hold-position information of the electronic component 90. For example, this component-hold-position information is in a data format consisting of positioning errors $\delta X$ and $\delta Y$ of the center of the electronic component 90 from the axis of the mounting head 88 in the X-axis and Y-axis directions, respectively, and a positioning error $\delta\theta$ of the electronic component 90 in the plane parallel to the surface of the circuit substrate 52 (in the $\theta$-axis direction). The component-hold-position information is stored in the RAM 124.

Then, the mounting head 88 is further intermittently turned, and mounting-position compensating step S6 is implemented. In the mounting-position compensating step, the mounting position is adjusted on the basis of the component-hold-position information described above. This adjustment consists of two adjustments, namely, an adjustment in the X-axis and Y-axis directions and an adjustment in the $\theta$-axis direction. The adjustment in the $\theta$-axis direction is made when the mounting head 88 is located at a station between the component-imaging station S and the component-mounting station D. That is, the adjustment in the $\theta$-axis direction is effected by adjusting the amount of rotation of the mounting head 88 about its axis on the basis of the component-hold-position information, so as to eliminate the above-indicated positioning error 89 of the electronic component 90 when the angular mounting position of the electronic component 90 is determined. The adjustment in the X-axis and Y-axis directions is effected when the substrate holding device 54 holding the circuit substrate 54 is moved to the predetermined component-mounting spot of the electronic component 90 to be mounted, on the basis of the above-indicated mounting-position information. That is, the distances of movement of the substrate holding device 54 are adjusted so as to eliminate the above-indicated positioning errors $\delta X$ and $\delta Y$.

Then, component-mounting step S7 is implemented when the mounting head 88 is located at the component-mounting station D after a further turning movement thereof and while the circuit substrate 52 is located at the component-mounting position. Namely, the electronic component 90 is mounted at the component-mounting spot represented by the above-indicated component-mounting information. Then, S8 is implemented to determine whether the mounting of all of the mounting objects is completed. If all of the mounting objects have not been mounted, the control flow goes back to S3 to initiate an operation to mount the next mounting object. In the present first component-mounting machine 12 which is a mounting apparatus of rotary head type, steps S3 through S7 implemented for each mounting head 88 are actually performed concurrently with those steps implemented for the other mounting heads 88.

If the electronic component is not sucked in the component-sucking step, that is, in the event of a sucking failure of the mounting head 88 to hold the electronic component, this electronic component is held by suction by one of the mounting heads 88 following the mounting head 88 which failed to hold the electronic component This is so-called a recovery action to hold the electronic component. The component-sucking step is controlled such that if the sucking failure of the same mounting object occurs two consecutive times, an operation to mount this mounting object is not performed. Information relating to the sucking failure of the recovery action is stored in the RAM 124 of the mounting control device 64.

Afer the mounting of all of the mounting objects is completed, mounting-operation-information preparing and transmitting step S9 is implemented. Mounting-operation information to be prepared is a kind of the substrate working information, which includes working-result information in the form of mounting-result information, and working-condition information in the form of mounting-condition information. In the present embodiment, the mounting-result information includes: mounting-failure information (one form of working-failure information) relating to the mounting object for which the mounting operation was not performed; re-mounting information (one form of re-working information) relating to the mounting object for which the recovery action was performed; and total-mounting-time information (one form of total-working-time information) relating to a time required for the mounting operations for all of the mounting objects. The prepared mounting-result information is transmitted to the mounting-result inspecting machine 16. The mounting-condition information includes: information relating to the suction nozzles 92 used for the respective mounting objects (used-nozzle information); information relating to the tape feeders 82 accommodating the electronic components 90 to be mounted (used-feeder information); and information relating to the adjustments made for each electronic component 90 on the basis of the position as held by suction (component-mounting-position adjustment information). The prepared mounting-condition information is transmitted to the mounting-result inspecting machine 16. Described more specifically, the mounting-operation information is prepared and transmitted in a data format indicated in TABLE 2 given below.

TABLE 2

<First component-mounting machine>
Substrate ID: XGB01233 Total mounting time: XXX sec.

| Mounting object | Component name | Nozzle | Feeder | Component position adjusting amounts | | | Mounting result |
|---|---|---|---|---|---|---|---|
| | | | | δX | δY | δθ | |
| A-001 | FG05689 | a-1 | A0004 | −3 | 1 | 1 | |
| A-002 | FG05689 | b-1 | A0004 | 2 | −2 | 1 | |
| A-003 | HY00356 | c-2 | A0006 | Sucking Failure | | | |
| A-004 | FG47725 | d-5 | A0007 | 2 | 1 | 2 | |
| A-005 | VR00047 | e-2 | A0008 | −2 | 2 | 1 | |
| A-006 | VF01478 | f-2 | A0010 | 6 | 11 | −3 | |
| A-007 | VD33325 | g-3 | A0011 | 4 | 3 | 1 | |
| A-008 | VD33325 | h-3 | A0011 | −1 | 0 | 2 | |
| A-003 | HY00356 | i-2 | A0006 | −1 | −1 | 1 | Recovery |
| A-009 | NN25554 | j-1 | A0013 | 3 | 2 | −4 | |
| A-010 | KT14487 | k-4 | A0014 | 2 | 1 | 2 | |
| A-011 | HH00023 | l-2 | A0015 | −4 | −3 | 1 | |
| A-012 | HG47662 | m-1 | A0017 | 1 | 1 | 1 | |
| ⋮ | ⋮ | ⋮ | ⋮ | ⋮ | ⋮ | ⋮ | |

There will be described TABLE 2. The first component-mounting machine 12 has the 16 mounting heads 88, each of which has the six suction nozzles 92. Lowercase alphabetic letter in the used-nozzle information indicative of the suction nozzles represents the appropriate mounting head 88, while the numeral following the hyphen represents the number of the suction nozzle 92 used. The used-feeder information represents the number of the tape feeder 83 used. The component-mounting-position adjusting information represents the adjusting amounts of the mounting position in arbitrary unit (a.u.), and the sign of the adjusting amounts indicates the direction of the adjustment, while the absolute value indicates the amounts of the adjustment. In the example of TABLE 2, the amount of adjustment for the mounting object A-006 is excessively large, and the mounting object A-003 had a sucking failure and was subjected to the recovery action to re-hold the electronic component 90. The mounting-operation information is prepared and transmitted in relation to the substrate-identifier information obtained in the substrate-identifier-information obtaining step S2.

The mounting-operation information is prepared and transmitted by the mounting control device 64. A portion of the computer 130 assigned to prepare the mounting-operation information constitutes a mounting-operation-information preparing portion, while a portion of the computer 130 assigned to transmit the mounting-operation information cooperates with the transmission/reception control circuit 136 to constitute a mounting-operation-information transmitting device (one form of substrate-working-operation-information transmitting device). In substrate-releasing step S10 implemented after the preparation and transmission of the mounting-operation information, the circuit substrate 52 on which the predetermined mounting objects have been mounted is released from the substrate holding device 54. Subsequently, the circuit substrate 52 is transferred to the downstream substrate transferring machine 20.

<Second Mounting Operation and Working Information>

The circuit substrate 52 on which some of the predetermined electronic components 90 have been mounted in the first component-mounting machine 12 is transferred onto the second component-mounting machine 14, and is subjected to a second electronic-component mounting operation (second component-mounting operation), which is one of the substrate working operations. This second component-mounting operation is also a mounting step, which is one of the substrate working steps in the fabrication of the electric circuit. Like the first component-mounting operation, the second component-mounting operation is performed by operating the mounting device of the second component-mounting machine 14 according to the flow chart of FIG. 12. The mounting device of the second component-mounting machine 14 is controlled by the mounting control device 164, according to the basic operation control program stored in the ROM 232, and the electronic-component mounting control program corresponding to the circuit substrate in question, which is stored in the RAM 234. The RAM 234 also stores information relating to operating devices used for the electronic components 90 to be mounted, such as information indicative of the tape feeders 172 of the component-supplying device 154 which accommodate those electronic components 90, and information indicative of the suction nozzles 182 suitable for the electronic components. The above-indicated electroniccomponent mounting control program is considered to be a program for performing working operations on the mounting objects, in a predetermined order on the basis of the information relating to those operating devices, and the mounting-object information described above.

There will be described the second component-mounting operation, which is similar to [that of] the first component-mounting operation. The second component-mounting operation is initiated with the substrate holding step S1 wherein the circuit substrate 52 which has been transferred by the substrate transferring machine 20 disposed downstream of the first component-mounting machine 12 is held by the substrate holding device 152, substantially at the predetermined position. Then, S2 is implemented to obtain the substrate-hold-position information and the substrate-identifier information. This step is a combination of a step of obtaining the substrate-identifier information and a step of obtaining the substrate-hold-position information. Unlike the first component-mounting machine 12, the present second component-mounting machine 14 is a mounting device of XY robot type in which the substrate imaging device 162 is moved by the XY robot device 160, in a plane parallel to the surface of the held circuit substrate 52, and above the circuit substrate 52. Except for this movement of the substrate imaging device 162, the present step S2 is identical with that in the first component-mounting machine 12, and will be only briefly described. The substrate-position fiducial mark 400 and the adjacent substrate ID mark 404 are imaged, and the other substrate-position fiducial mark 402 is also imaged. The thus obtained image data are processed to obtain the substrate-hold-position information and the substrate-identifier information. Like the substrate-hold-position information in the first component-mounting operation, the substrate-hold-position information in the present component-mounting operation indicates the actual positioning errors of the substrate with respect to the nominal hold-position of the circuit substrate. For instance, the substrate-hold-position information is in a data format consisting of a positioning error ΔXb2 of the circuit substrate in the X-axis direction, a positioning error ΔYb2 of the circuit substrate in the Y-axis direction, and a positioning error θb2 of the circuit substrate in the θ-axis direction. The substrate-hold-position information is stored in the RAM 234, together with the substrate-identifier information. In addition, the mounting control device 164 establishes an operational coordinate system as distinguished from the above-indicated mechanical coordinate system, on the basis of the obtained positional data, and motions and working operations relating to the circuit substrate 52 which will be described are commanded by specifying the positions as defined within this operational coordinate system, as in the first component-mounting operation.

S3 through S7 are a series of steps for mounting each electronic component. In the present second component-mounting machine 14 of XY robot type, the mounting unit 158 is moved by the XY robot device 160, between the two component-supplying devices 154, 156 and the circuit substrate 52 held by the substrate holding device 152, more specifically, between the tape feeders 172 accommodating the electronic components 90 to be mounted, and the component-mounting spots on the circuit substrate 52 at which the electronic components 90 are to be mounted. Thus, the electronic components are held by suction and mounted. Except for this aspect, the second mounting-operation is almost identical with the first component-mounting operation. It is noted that the suction nozzle 182 can be interchanged with one of the suction nozzles 182 accommodated in the nozzle storage devices 192, as desired. Before the electronic component 90 to be mounted is held by suction, the suction nozzle 182 is replaced with the one suitable for that electronic component 90. The information indicative of the tape feeders 172 from the electronic components 90 to be mounted have been supplied, and the information indicative of the suction nozzles 182 used to hold the electronic components are stored in the RAM 234.

Further, the component-hold-position information of the electronic components 90 obtained by the component imaging device 220 between the moments of sucking and mounting of the electronic components is also stored in the RAM 234. In the component-mounting-position adjusting step, the adjustment in the θ-axis direction is made when the angular mounting position of each electronic component 90 is determined by rotation of the mounting head 184, while the adjustment in the X-axis and Y-axis directions is effected when the mounting unit 158 is positioned at the component-mounting spots. The series of steps S3 through S7 is repeated until all of the mounting objects have been mounted. The sucking failure and the recovery action to re-hold the electronic component, which have been described above with respect to the first component-mounting operation, are applicable the present second component-mounting operation, and information relating to these sucking failure and recovery action is also stored in the RAM 234.

As in the first component-mounting operation, the mounting-operation-information preparing and transmitting step S9 is implemented after the mounting of all of the mounting objects is completed. As in the first component-mounting operation, the mounting-operation information to be prepared and transmitted includes mounting-result information such as the mounting-failure information, re-mounting information and total-mounting-time inform ation, and mounting-condition information such as the used-nozzle information, used-feeder information a nd component-mounting-position adjusting information. The mounting-operation in formation prepared in the second component-mounting operation and sitted sto the mounting-result inspecting machine 16 has a data format indicated in TABLE 3 given below.

TABLE 3

<Second component-mounting machine>
Substrate ID: XGB01233 Total mounting time: YYY sec.

| Mounting object | Component name | Nozzle | Feeder | Component position adjusting amounts δX | δY | δθ | Mounting result |
|---|---|---|---|---|---|---|---|
| B-001 | DK01255 | 1 | B0011 | 2 | −2 | 1 | |
| B-002 | BB58843 | 1 | B0002 | 1 | −3 | −3 | |
| B-003 | BB58843 | 1 | B0002 | −2 | −8 | 14 | |
| B-004 | GF00141 | 1 | B0022 | 3 | 1 | 1 | |
| B-005 | KU11137 | 1 | B0004 | −1 | 3 | 2 | |
| B-006 | NR22300 | 1 | B0005 | −1 | 1 | 1 | |
| B-007 | HD11447 | 1 | B0009 | | | | Sucking failure |
| B-007 | DD11447 | 1 | B0009 | | | | Sucking failure |
| B-007 | HD11447 | 1 | B0009 | | | | Mountingfailure |
| B-008 | BE61632 | 1 | B0018 | 1 | −2 | 3 | |
| A-009 | CS00055 | 2 | B0012 | 2 | −1 | −2 | |
| A-010 | ZA00007 | 2 | B0006 | 4 | 1 | −1 | |
| A-011 | GP22214 | 6 | PP | −3 | 2 | 1 | |
| : | : | : | : | : | : | : | : |

There will be described TABLE 3. The second component-mounting machine 14 has the eight suction nozzles 182. The numeral in the used-nozzle ingmation represents the number of the suction nozzle 192 used, and the used-feeder informat.ion represents the number of the tape feeder 172 used ("PP" representing that the electronic component is supplied from a parts pallet). The comnponent-mounting-position adjusting information is the same as in the first component-mounting operation. In the example of TABLE 3, the amount of adjustment for the mounting object B-003 is excessively large, and the mounting object B-007 had three occurrences of sucking failure and was not mounted due to a failure of the recovery action. As in the first component-mounting operation, the mounting-operation information is prepared and transmitted in relation to the substrate-identifier information obtained in the substrate-identifier-information obtaining step S2. The mounting-operation information is prepared and transmitted by the mounting control device 164. A portion of the computer 240 assigned to prepare the mounting-operation information constitutes a mounting-operation-information preparing portion, while a portion of the computer 240 assigned to transmit the mounting-operation information cooperates with the trflsrission/reception control circuit 246 to constitute a mounting-operation-information transmitting device (one form of substrate-working-operation-information transmitting device).

<Historical information>

Before discussing the mounting-result inspection, there will be described historical information. In the present embodiment, the RAM 353 of the inspection control device 308 of the mounting-result inspecting machine 16 stores operating-device historical information, which is a kind of the historical information. Described in detail, the RAM 353 stores used-device information indicative of the devices of the first component-mounting machine 12 and the second component-mounting machine 14 which are used for performing the substrate working operations. Described in more detail, the used-device information includes device-efect information indicative of a defect ratio (unit: %) of each suction nozzle 92, 182, and device-operation information indicative of the number of operations of each suction nozzle 92, 182 to mount the electronic components, and the time of use of each tape feeder 82, 172 (total operating time after the initial use). For example, the historical information has a data format as indicated in TABLE 4 given below.

TABLE 4

| | Nozzles | | Feeders | |
|---|---|---|---|---|
| No. | Defect Ratio | Number of Operations | No. | Time of use |
| <First component-mounting machine> | | | | |
| a-1 | 0.03 | 12567 | A0001 | 1254 |
| a-2 | 0.20 | 14558 | A0002 | 3254 |
| a-3 | 0.01 | 6890 | A0003 | 2458 |
| a-4 | 0.11 | 12845 | A0004 | 489 |
| a-5 | 0.23 | 21542 | A0005 | 1422 |
| a-6 | 0.04 | 6622 | A0006 | 1465 |
| <u>b-1</u> | <u>1.5</u> | 14756 | A0007 | 796 |
| b-2 | 0.17 | 1814 | A0008 | 2458 |
| b-3 | 0.12 | 4136 | A0009 | 1136 |
| : | : | : | : | : |
| : | : | : | : | : |
| <Second component-mounting machine> | | | | |
| 1 | 0.24 | 12584 | B0001 | 2455 |
| <u>2</u> | 0.21 | <u>245878</u> | B0002 | 1835 |
| 3 | 0.05 | 5471 | B0003 | 3653 |
| 4 | 0.33 | 14369 | B0004 | 6321 |
| 5 | 0.02 | 35899 | <u>B0005</u> | 20587 |
| 6 | 0.08 | 2586 | B0006 | 1124 |
| : | : | : | : | : |
| : | : | : | : | : |

As indicated in TABLE 4, the historical information of the first component-mounting machine 12 indicates that the #1 suction nozzle 92 of the mounting head 88 whose number is "b" has a high defect ratio. That is, the historical information indicates a high possibility that the #b-1 suction nozzle 92 fails to perform the intended mounting operation of the corresponding mounting object. In addition, the historical information of the second component-mounting machine 14 indicates that the #2 suction nozzle 182 has performed a comparatively large number of mounting operations while the #B0005 tape feeder 172 has a comparatively long total operating time. Namely, the #2 suction nozzle 182 which has been used a large number of times and the #B0005 tape feeder 172 which has been operated for a long time are considered to have a high possibility of failure to perform the intended mounting operation of the corresponding mounting objects, if these devices are continuously used.

<Inspecting operation and related operations>

Results of the first and second component-mounting operations performed by the first component-mounting machine 12 and the second component-mounting machine 14 are inspected by the mounting-result inspecting machine 16 disposed on the downstream side of the second component-mounting machine 14. As described above, the mounting-result inspecting machine 16 is an inspecting machine of XY robot type wherein the substrate imaging device 304 is moved by the XY robot device 306, to image the electronic components 90 mounted on the circuit substrate 52, so that the image data are processed to inspect the positioning errors of the mounted electronic components. The operation to inspect the mounting results is performed by operating the inspecting devices of the mounting-result inspecting machine 16 according to a flow shown in FIG. 13. The inspecting devices of the mounting-result inspecting machine 16 are controlled by the inspection control device 308, according to the basic operation program stored in the ROM 352 and the operating procedure which has been determined by the inspection control device 308 for each of the circuit substrates 52.

Initially, substrate-holding step S21 is implemented to hold the circuit substrate 52 which has been transferred from the upstream substrate transferring machine 20 and on which the electronic components 90 have been mounted. Then, substrate-identifier-information and substrate-hold-position-information obtaining step S22 is implemented to obtain the substrate-hold-position information and the substrate-identifier information. This step is implemented in a similar to that in the second component-mounting operation described above, since the present mounting-result inspecting machine 16 is similar to the second component-mounting machine 14 of XY robot type. Briefly described, the one substrate-position fiducial mark 400 and the adjacent substrate ID mark 404 are imaged by the substrate imaging device 304, and then the other substrate-position fiducial mark 402 is imaged. The obtained image data are processed to obtain the substrate-hold-position information and the substrate-identifier information. As in the component-mounting operations, the substrate-hold-position information relates to the positioning errors of the circuit substrate with respect to the predetermined nominal position. For instance, the substrate-hold-position information has a data format consisting of a positioning error $\Delta Xb3$ of the circuit substrate in the X-axis direction, a positioning error $\Delta Yb3$ of the circuit substrate in the Y-axis direction, and a positioning error $\theta b1$ of the circuit substrate in the $\theta$-axis direction. The substrate-hold-position information is stored in the RAM 354, together with the substrate-identifier information. In addition, as in the component-mounting operations, the inspection control device 308 establishes an operational coordinate system as distinguished from the above-indicated mechanical coordinate system, on the basis of the obtained positional data. Motions and working operations relating to the circuit substrate 52, which will be described, are commanded by specifying the positions as defined within this operational coordinate system. The positioning errors of the electronic components 90 are also defined within this operational coordinate system.

Then, mounting-operation-information reading step S23 is impleinented to read out from the RAM 354 a portion of the mounting-operation information stored therein, which portion relates to the first and second component-mounting operations performed on the circuit substrate 52 identified by the substrate-identifier information obtained in S22. The mounting-operation information has been transmitted to the inspection control device 308, for storage in the RAM 354. That is, the mounting-operation information stored in relation to the substrate-identifier information of the appropriate circuit substrate is read out from the RAM 354. Inspecting-procedure determining step S24 is then implemented to determine a procedure for the inspecting operation, on the basis of the read-out mounting-operation information.

A routine for determining the inspecting procedure in S24 is executed according to a flow shown in FIG. 14. Initially, inspecting-object excluding step S101 is implemented to select from the working objects, namely, mounting objects subjected to the mounting operations on the circuit substrate 52, those mounting objects which are not to be subjected to the inspecting operation. Described in detail with respect to the mounting objects listed in TABLE 2 and TABLE 3 given above, the mounting object B-0007 in the form of the electronic component 92 which has not been mounted is excluded from the inspecting objects. That is, the present inspecting-object excluding step is astep of excluding any mounting object from the inspecting objects, on the basis of the mounting-failure-object information. The RAM 354 has a non-excluded-mounting-object memory portion for storing non-excluded mounting objects which are the mounting objects other than the excluded mounting objects.

Then, re-mounted-object selecting step S102 is implemented to select, as an inspecting object, any re-mounted object subjected to the recovery action, from the above-indicated non-excluded mounting objects. Described in tail with respect to the mounting objects listed in TABLE 2 and TABLE 3 given above, the mounting object A-003 subjected to the recovery action is selected as the re-mounted object. That is, the present re-mounted-object selecting step is a step of recognizing any re-mounted object as a potentially defective mounting object, on the basis of the re-mounted-object information, and selecting the re-mounted object as the inspecting object. The potentially defective mounting object has a high possibility that the mounting operation performed thereon is unacceptable. The RAM 354 has an inspecting-object memory portion, and each re-mounted object is stored as one of the inspecting objects.

Then, excessively-adjusted-object selecting step S103 is implemented to select, as an inspecting object, any mounting object of excessive large amount of positional adjustment made on the basis of the hold-position information of the electronic component 90, from the above-indicated non-excluded mounting objects. Described in detail with respect to the mounting objects listed in TABLE 2 and TABLE 3 given above, the mounting objects A-007 and B-003 are selected as the inspecting objects. That is, the present excessively-adjusted-objeci selecting step is a step of recognizing any mounting object of excessive position adjustment as the potentially defective mounting object, on the basis of the component-mounting-position adjusting information (one form of the mounting-condition information), and selecting this mounting object as the inspecting object.

Each mounting object of excessive position adjustment is additionally stored in the inspecting-object memory portion of the RAM 354.

High-defect-ratio-nozzle-mounted-object selecting step S104 is then implemented to select, as an inspecting object, any mounting object mounted with any suction nozzle 92, 182 of high defect ratio, from the above-indicated non-excluded mounting objects. To this end, any suction nozzles whose defect ratio is higher than a predetermined threshold are determined on the basis of the device-defect historical information, and the mounting objects mounted with these suction nozzles of high defect ratio are selected on the basis of the already received used-nozzle information. Described in detail with respect to the mounting objects listed in TABLE 2 and TABLE 3 given above, the mounting object A-002 mounted by the "b-1 suction nozzle 92 is determined as the mounting nozzle of high defect ratio, on the basis of the historical information illustrated in TABLE 4 given above. That is, the present high-defect-ratio- nozzle-mounted-object selecting step is a step of recognizing any potentially defective mounting object on the basis of the device-defect historical information and the used-device information, and selecting this potentially defective mounting object as the inspecting object. Each mounting object mounted with the suction nozzle of high defect ratio is additionally stored in the inspecting-object memory portion indicated above.

Then, frequently-used-nozzle-mounted-object selecting step S105 is implemented to select, as an inspecting object, any mounting object mounted with any suction nozzle 92, 182 having a large number of mounting operations, from the above-indicated non-excluded mounting objects. Namely, any mounting object mounted with the suction nozzle 92, 182 having a high frequency of use is selected as the inspecting object. To this end, any suction nozzles of frequent use whose number of mounting operations is larger than a predetermined threshold are recognized on the basis of the above-indicated device-defect historical information, and the mounting objects mounted with the suction nozzles of frequency use are selected on the basis of the already received used-nozzle information indicated above. Described in detail with respect to the mounting objects listed in TABLE 2 and TABLE 3 given above, the mounting objects B-009 and B-010 mounted with the #2 suction nozzle 192 are selected on the basis of the historical information illustrated in TABLE 4 given above. That is, the present frequently-used-nozzle-mounted-object selecting step is one form of a step of recognizing any potentially defective mounting object on the basis of the device-defect historical information and the used-device information, and selecting this potentially defective mounting object as the inspecting object. Each mounting object mounted with the frequently used suction nozzle is additionally stored in the inspecting-object memory portion indicated above.

Then, frequently-used-feeder-supplied-object selecting step S106 is implemented to select, as an inspecting object, any mounting object in the form of the electronic component supplied from the tape feeder 82, 172 having a long total operating time, from the above-indicated non-excluded mounting objects. Namely, any mounting object corresponding to any tape feeder 82, 172 which has supplied a large number of electronic components is selected as an inspecting object. To this end, any tape feeders whose total operating time is longer than a predetermined threshold are recognized on the basis of the above-indicated device-defect historical information stored in the RAM 354, and the mounting objects corresponding to these tape feeders of the long total operating time are selected on the basis of the already received used-nozzle information indicated above.

Described in detail with respect to the mounting objects listed in TABLE 2 and TABLE 3 given above, the mounting object B-006 supplied from the #B0005 tape feeder 172 is selected on the basis of the historical information illustrated in TABLE 4 given above. That is, the present frequently-used-feeder-supplied-object selecting step is one form of a step of recognizing any potentially defective mounting object on the basis of the device-defect historical information and the used-device information, and selecting this potentially defective mounting object as the inspecting object. Each mounting object in the form of the electronic component supplied from the frequently used tape feeder is additionally stored in the inspecting-object memory portion indicated above.

Each of the above-indicated re-mounted-object selecting step, excessively-adjusted-object selecting step, high-defect-ratio-nozzle-mounted-object selecting step, frequently-used-nozzle-mounted-object selecting step and fequently-used-feeder-supplied-object of S103 through S106 is formulated to select any potentially defective mounting object having a high possibility of mounting failure, on the basis of the mounting-operation information. These steps may be collectively referred to as a potentiallydefective-object selecting step. After this potentially-defective-object selecting step is implemented, only the potentially defective mounting objects are stored as the inspecting objects in the inspecting-object memory portion of the RAM 354.

Additional-inspecting-object selecting step S107 is then implemented to select additional inspecting objects, from the mounting objects other than the potentially defective mounting objects. Where the present electric-circuit fabricating system is operated to fabricate a plurality of electric circuits of the same kind in one lot, the mounting objects of any kind for the respective different circuit substrates may not be selected as any of the inspecting objects, that is, as any of the above-indicated the potentially defective mounting objects, and have not been inspected throughout the lot. When the mounting objects on a given circuit substrate 52 in the lot is inspected, the inspecting-operation historical information already obtained for the circuit substrate(s) 52 used in the same lot is stored in the RAM 354. This inspection-operation historical information includes information indicative of the mounting objects which were selected as the inspecting objects on the other circuit substrate(s). In the present additional-inspecting-object selecting step, the additional inspecting objects are selected on the basis of this inspection-operation historical information so that the mounting objects of each kind for the respective circuit substrates used in the lot are inspected are inspected at a frequency not lower than a predetermined threshold. Described in detail, the number of the mounting objects of each kind which have not been inspected for the successive circuit substrates 52 is counted as a non-inspection count "n", and appropriate ones of the mounting objects which have not been inspected are selected as the additional inspecting objects so that the non-inspection count "n" does not exceed a predetermined threshold n0. Described more specifically, if the non-inspection count "n" of a given mounting object mounted on the circuit substrate 52 under inspection has exceeded the threshold n0 because this mounting object is not selected as one of the inspecting objects on this circuit substrate, this mounting object is selected as an additional inspecting object. According to this arrangement, the mounting objects of any kind are inspected at a frequency not lower than 1/n0. Each of the selected additional inspecting objects is additionally stored in the above-indicated inspecting-object memory portion of the RAM 354.

Figure 15A:
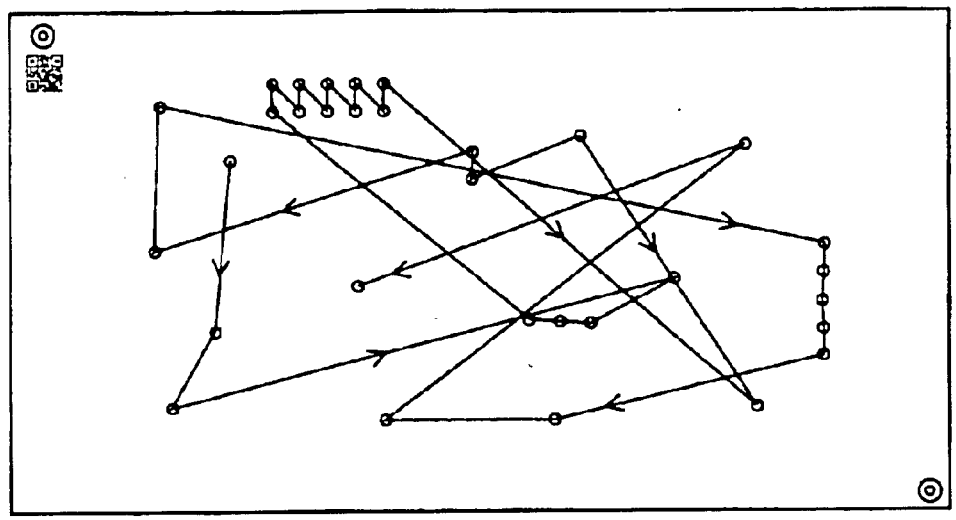
FIG. 15 is a view schematically illustrating the order of inspection in the inspecting operation.
Figure 15B:
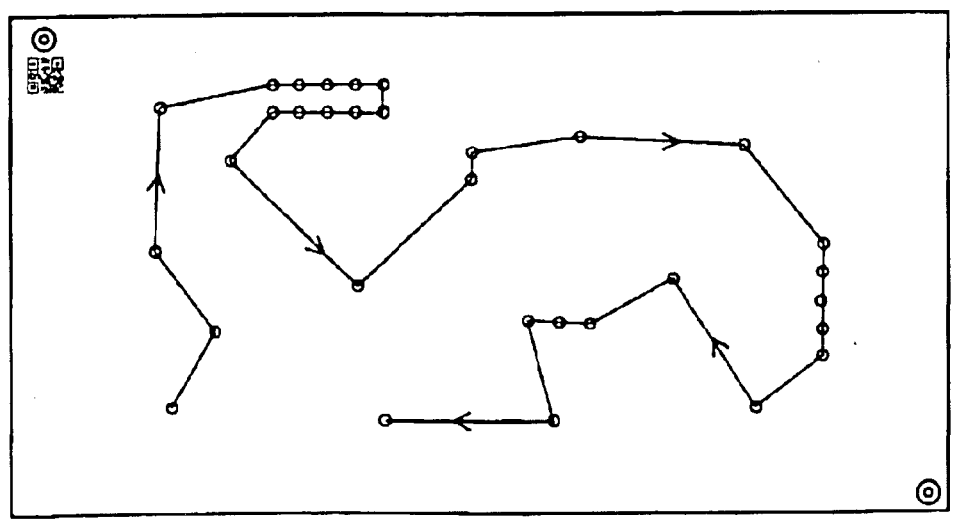

In the next inspecting-order determining step S108, the order in which the inspecting objects selected in the foregoing steps are inspected is determined. Roughly speaking, a time required for the inspection is determined by times for moving the substrate imaging device 304 to all of the inspecting objects, times for imaging the inspecting objects, times for processing the obtained image data, etc. Of these times, the times for moving the substrate imaging device 304 have a relatively high ratio to the total time required for the inspection. For example, if the inspecting objects are inspected in the order in which the mounting objects are mounted, as indicated in FIG. 15(*a*), the path of movement of the substrate imaging device 304 is relatively long, and the required time for the movement is relatively long. In view of this, the order of inspection of the inspecting objects is determined so as to shorten the path of movement of the substrate imaging device 304, for thereby reducing the required time for the movement. For instance, the inspecting order is determined such that the substrate imaging device 304 is moved along a path as indicated in FIG. 15(*b*). More specifically, the inspecting order may be determined in the following manner. The mounting-position information for each mounting object is stored in the RAM 354, as indicated in TABLE 1 given above, so that a distance between the adjacent mounting objects corresponding to the selected inspecting objects is calculated on the basis of the mounting-position information, and a total distance of movement alongeach of all possible paths of movement of the substrate imaging device 304 is calculated. The path having the shortest total distance of movement is selected as the path, and the inspecting order is determined according to the selected path.

Then, inspecting-time determining step S109 is implemented to estimate a time required for the inspecting operation, on the basis of the selected inspecting objects and the determined order of inspection of the inspecting objects, and determine whether the estimated time for the inspecting operation is within a predetermined time. Described in detail, the present embodiment is arranged to estimate the required inspecting time, by summing products of an imaging time and image data processing time and the number of the inspecting objects, and a time for movement of the substrate imaging device 304 by the XY robot device 306, which is obtained from the speed of movement and the above-indicated total distance of movement. The imaging time and image data processing time are predetermined on the basis of a result of actual inspecting operations. If the estimated required inspecting time is longer than the predetermined time, the present inspection procedure determining routine is terminated, and the inspecting operation is initiated. If the estimated required inspecting time is shorter than the predetermined time, the control flow goes to the next fiuther-additional-inspecting-object selecting step S110.

In the further-additional-inspecting-object selecting step S110, any other appropriate mounting object is selected as a further additional inspecting object. Namely, the further-additional-inspecting-object selecting step is arranged to select, as the further additional inspecting object, any mounting object the non-inspection count "n" of which would be equal to (n0–1) if this mounting object were not inspected this time. Each fuither additional inspecting object is additionally stored in the inspecting-object memory portion of the RAM 354. Then, inspection-order re-determining step S111 is implemented to determine the order in which all of the inspecting objects including the further additional inspecting object(s) are inspected. This order of inspection is determined in the same manner as in the above-indicated inspecting-order determining step S108. Then, inspecting-time re-determining step S112 is implemented to estimate the estimated required time for inspecting the inspecting objects in the re-determined order, in the same manner as in the above-indicated inspecting-time determining step S109, and to determine whether the estimated required inspecting time is within the predetermined time indicated above.

If the required inspecting time is within the predetermined time, the control flow goes back to the further-inspecting-object selecting step S110 wherein any other appropriate mounting object is selected as a further additional inspecting object. In this case, any mounting object the non-inspection count "n" of which would be equal to (n0–2) if this mounting object were not inspected this time is selected as a further additional inspecting object. Then, the inspecting-order re-determining step S111 is implemented, and the inspecting-time redetermining step S112 is implemented to determine whether the required inspecting time is within the predetermined time. A loop consisting of those steps S110, S111 and S112 is repeatedly executed, by decrementing the threshold value to be compared with the non-inspection count "n", until the required inspecting time has exceeded the predetermined time. If the required inspecting time has exceeded the predetermined time, funher-additional-injection-object deleting step S113 is implemented to delete the last added further additional inspecting object(s), and the present inspecting operation procedure determining routine is terminated.

The inspection operation procedure detennining routine described above is executed by the inspection control device 308. Therefore, a portion of the inspection control device 308 assigned to determine the inspecting procedure constitutes an operating-procedure determining portion. Further, a portion of this operating-procedure determining portion assigned to implement the step S100 constitutes an inspecting-object excluding portion, and a portion of the operating-procedure determining portion assigned to implement the steps S102–S110 constitutes a potentially-defective-object selecting portion, while a portion of the inspecting procedure determining portion assigned to implement the steps S107–S110 constitutes an additional-object selecting portion. Further, a portion of the inspecting procedure determining portion assigned to implement the steps S108 and S111 constitutes an inspecting-order determining portion, and a portion of the inspecting procedure determining portion assigned to implement the loop of the steps S110–S112 and the step S113 constitutes a time-based selecting portion which is arranged to select the inspecting objects such that the inspection of the selected inspecting objects is completed within a predetermined inspecting time.

After the inspecting procedure is determined, inspecting step S25 is implemented to perform the inspecting operation according to the determined inspecting procedure. The inspecting objects in the form of the electronic components 90 and their vicinities are imaged by the substrate imaging device 304, according to the determined inspecting procedure, and the thus obtained image data are processed to obtain the positioning errors of the inspecting objects. As described above, the mounting-position information of each mounting object as illustrated in TABLE 1 is stored in the RAM 354 of the inspection control device 308. Described in detail, the positioning error $\Delta X$ in the X-axis direction, the positioning error $\Delta Y$ in the Y-axis direction and the positioning error $\Delta \theta$ in the $\theta$-axis direction are obtained according to the stored mounting-position information. These obtained positioning errors are stored in the RAM 354. After it is determined in S26 that all of the inspecting objects have been inspected, the control flow goes to the next inspection-result-information preparing step S27.

In the inspection-result-information preparing step S27, inspection-result information of all of the inspected inspecting objects is prepared. Described in tail, the inspection-result information has a data format as indicated in TABLE 5 given below. It is noted that the positioning errors in TABLE 5 are indicated in arbitrary unit (auk.), and that the sign of the positioning errors indicates the direction of the errors, while the absolute value of the positioning errors indicates the amounts of the errors. If any of the positioning errors of a given inspecting object is larger than a predetermined threshold, this inspecting object is determined to be labeled "NG", that is, to be defective. A result of this determination is also stored in the RAM 354. The inspection-result information is used for various purposes, for example, for determining whether the circuit substrate 52 under inspection is acceptable or not, for correcting or rectifying the inspecting object which has been determined defective, and for analyzing the states of the first component-mounting machine 12 and the second component-mounting machine 14. In the example of TABLE 5 given below, the mounting objects A-004, A011, B001 and B-008 are selected as the additional inspecting objects, in addition to the potentially defective mounting objects.

TABLE 5

Substrate ID: XGB01233

| Inspecting Object | Component Name | Mounting Result | Nozzle | Feeder | Position Adjustment | | | Positioning Errors | | | Inspection Result |
|---|---|---|---|---|---|---|---|---|---|---|---|
| | | | | | $\Delta X$ | $\Delta Y$ | $\Delta \theta$ | $\Delta X$ | $\Delta Y$ | $\Delta \theta$ | |
| A-002 | FG05689 | | b-1 | A0004 | 2 | −2 | 1 | 1 | 2 | 2 | OK |
| A-003 | HY00356 | Recovery | i-2 | A0006 | −1 | −1 | 1 | 0 | 1 | 0 | OK |
| A-004 | FG47725 | | d-2 | A0007 | 2 | 1 | 2 | −3 | −2 | −1 | OK |
| A-006 | VF01478 | | f-2 | A0010 | 6 | 11 | −3 | 2 | −15 | 1 | NG |
| A-011 | HH00023 | | l-2 | A0015 | −4 | −3 | 1 | 2 | −1 | 0 | OK |
| : | : | : | : | : | : | : | : | : | : | : | : |
| : | : | : | : | : | : | : | : | : | : | : | : |
| B-001 | DK01255 | | | 1 | B0011 | 2 | −2 | 1 | 1 | 2 | −2 | OK |
| B-003 | BB58843 | | | 1 | B0002 | −2 | −8 | 14 | 1 | 2 | 2 | OK |

TABLE 5-continued

Substrate ID: XGB01233

| Inspecting Object | Component Name | Mounting Result | Nozzle | Feeder | Position Adjustment | | | Positioning Errors | | | Inspection Result |
|---|---|---|---|---|---|---|---|---|---|---|---|
| | | | | | ΔX | ΔY | Δθ | ΔX | ΔY | Δθ | |
| B-006 | NR22300 | | 1 | B0005 | −1 | 1 | 1 | −1 | 1 | 1 | OK |
| B-008 | BE61632 | | 1 | B0018 | 1 | −2 | 3 | −2 | 1 | 1 | OK |
| B-009 | CS00055 | | 2 | B0012 | 2 | −1 | −2 | 1 | −1 | 12 | NG |
| B-010 | ZA00007 | | 2 | B0006 | 4 | 1 | −1 | 1 | 1 | −4 | OK |

After the inspec tion-result information istprepared, historical-information updating step S28 is implemented to update the historical information presently stored in the RAM 354. This updat ing of the historical information is effected on the basis of the above-indicated mounting-operation infofmation and the prepared inspection-result information. Described in detail with respect to the historical information illustrated in TABLE 4 given above, the mounting-operation information illustrated in TABLE 2 and TABLE 3 given above and the inspection-result information illustrated in TABLE 5 given above, the historical information is updated in the following manner. In this example, the inspecting objects A-006 and B-009 were found defective in their mounting states, so that the device-defect historical information of the suction nozzles 91, 182 indicative of their defect ratios are updated according to the inspecti on-result information, on an assumption that the defective mounting was caused by the #f-2 suction nozzle 92 and the #2 suction nozzle 182 used for mounting the inspected mounting objects. In addition, the device-usage historical information of the suction nozzles 91, 182 indicative of their numbers of mounting operations is updated by adding the numbers of mounting operations represented by the used-device information, more specifically, the used-nozzle information of the mounting-operation information. Further, the device-usage historical information of each of the tape feeders 81, 172 indicative of its total operating times is updated by adding the total operating time of the first or second component-mounting operation, which is a kind of the mounting-result information. The historical information thus updated is utilized for the subsequent mounting-result inspecting operation. It is noted that a portion of the inspection control device 308 assigned to implement the present step constitutes a historical-information updating portion.

After the inspecting operation and the related operations such as the preparation of the inspection-result information are completed, substrate releasing step S29 is implemented to release the circuit substrate 52 which has been held by the substrate holding device 302. The inspection of the mounting result is terminated upon completion of this step. In the present embodiment, the inspecting procedure is determined on the basis of the mounting-operation information, and the inspection is effected according to the inspecting procedure, so that the inspection can be achieved efficiently.

<Modified Forms of the Invention>

In the embodiment described above, the historical information includes the information relating to the defect ratios of the suction nozzles 92, 182, the information relating to the numbers of mounting operations of the suction nozzles 92, 182, and the information relating to the operating times of the tape feeders 82, 172. The historical information is not limited to these kinds of information, but may include, for instance, information relating to the number of sucking failures of each of the suction nozzles 92, 182. Thus, the historical information may include various kinds of information.

In the above-described embodiment, the inspecting objects are selected on the basis of the required inspecting time upon determination of the inspecting procedure, so that the inspecting operation is completed within the predetermined time. However, the predetermined inspecting time may be determined as desired, or may be determined on the basis of the mounting-operation information. For example, the predetermined inspecting time maybe determined on the basis of the total mounting time, which is included in the mounting-result information as described above. For instance, the predetermined inspecting time may be determined on the basis of the total mounting time required for the circuit substrate under inspection, or an average of the total mounting times required for the circuit substrates on which the mounting operations have been performed. In these modified forms, too, the inspecting procedure is determined on the basis of the substrate working operations. Where two or more mounting machines are arranged in a line, the longest one of the total mounting times of the mounting machines may be utilized to determine the predetermined inspecting time, in view of a line tact time in the fabrication of the electric circuits.

In the above-described embodiment, the historical information is stored in the inspection control device 308 of the mounting-result inspecting machine 16. The historical information may be stored in the mounting control devices 64, 164 of the first and second component-mounting machines 12, 14, rather than or as well as the inspection control device 308. In this case, for example, the historical information is transmitted from the inspection control device 308 to the mounting control devices 64, 164, after the historical information is updated. It is advantageous to store the historical information on the side of the component-mounting machines, since this historical information can be easily utilized even after the component-mounting machines are separated from the mounting-result inspecting machine, as a result of a change in the arrangement of the fabrication line. The historical information stored on the side of the component-mounting machines is also advantageous in that the historical information can be easily administered when the historical information is reset or updated upon changing of the suction nozzles, tape feeders and other devices of the component-mounting machines.

In the above-described embodiment, the mounting-result inspectingmachine 16 is arranged to inspect each inspecting object with a single operation of the substrate imaging device 304. Alternatively, a plurality of inspecting objects may be inspected by a single operation of a substrate imaging device, which is provided with a CCD camera capable of taking an image of a relatively large surface3 area. In this case, when a potentially defective mounting object selected as an inspecting object is imaged, the obtained image may also cover some other mounting objects (referred to as the additional inspecting objects in the above-described embodiment) adjacent to the potentially defective mounting object, so that the inspection can be effected efficiently.

In the above-described embodiment, the substrate working apparatuses are connected to each other through the communication cable 26, and each substrate working apparatus is provided with a control device for controlling its working operation. Alternatively, however, a line control device such as a host computer may be provided for controlling the entire electric-circuit fabricating line in a centralized or coordinated manner. In this case, various kinds of information such as the substrate-working information, and information such as the historical information are integrally stored in the line control device, so that the line control device can determine the inspecting procedure and update the historical information.

Figure 16:
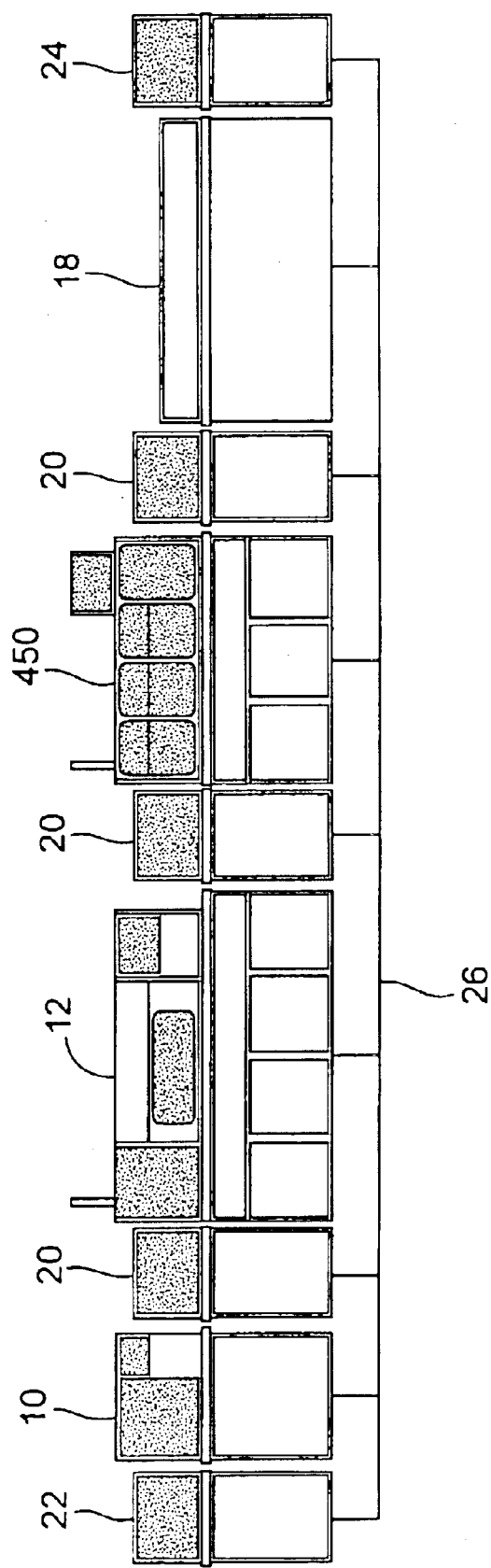
FIG. 16 is a view showing a modified form of the electric-circuit fabricating system.

In the above-described embodiment, the mounting-result inspecting machine 16 is incorporated as an independent mounting-result inspecting device in the line. Alternatively, a component-mounting machine may be a unit consisting of a component-device and a mounting-result inspecting device. FIG. 16 shows this modification, wherein a second component-mounting machine 450 is equipped with an inspecting device. The mounting-result inspecting device of this second component-mounting machine 450 is arranged to inspect a result of the mounting operation of the upstream first component-mounting machine 12, and a result of the mounting operation of the component-mounting device of the second component-mounting machine 450. The second component-mounting machine 450 provided with the inspecting device is substantially identical in construction with the second component-mounting machine 14 in the above-described embodiment. The second component-mounting machine 450 is provided with the substrate imaging device 162 to image the mounted electronic components 90, and the substrate image processing unit 226 to process the image data to obtain the positioning errors of the mounting objects. Accordingly, a mounting control device of the present second component-mounting machine 450 performs the function of the inspection control device 308. Thus, the electric-circuit fabricating line does not require an independent inspecting machine, and can be simplified. It is noted that the first component-mounting machine 12 may be similarly arranged to have a function of an inspecting device.

What is claimed is:

1. A substrate-working-result inspecting apparatus for inspecting a result of substrate working operations performed on a circuit substrate, comprising:
   an inspecting device for performing an inspecting operation; and
   an inspection control device provided with;
   an operating-procedure determining portion for determining an operating procedure of said inspecting operation on said circuit substrate, said operating-procedure determining portion selecting inspecting objects to be inspected, on the basis of substrate working information of said working operations performed on said circuit substrate, and determining an order in which the selected inspecting objects are sequentially inspected; and
   an operation control portion for controlling said inspecting device according to the determined operating procedure.

2. A substrate-working-result inspecting apparatus according to claim 1, wherein said substrate working operations are electric-component mounting operations to mount electric components on said circuit substrate, and said inspecting device inspects a result of mounting of the electronic components mounted by said electron-component mounting operations.

3. A substrate-working-result inspecting apparatus according to claim 1, wherein said operating-procedure determining portion determines said operating procedure of said inspecting operation, further on the basis of historical information relating to said substrate working operations.

4. A substrate-working-result inspecting apparatus according to claim 1, wherein said operating-procedure determining portion includes a time-based selecting portion for selecting said inspecting objects to be inspected, such that said inspecting operation is completed within a predetermined inspecting time.

5. A substrate-working-result inspecting apparatus according to claim 1, wherein said operating-procedure determining portion includes an inspecting-order determining portion for determining an order of inspection of said inspecting objects, so as to minimize a time required for inspecting said inspecting objects.

6. A substrate-working-result inspecting apparatus according to claim 1, wherein said operating-procedure determining portion selects said inspecting objects, further on the basis of historical information relating to said substrate working operations,
   and wherein said inspection control device includes a historical-information updating portion for updating said historical information.

7. A substrate-working-result inspecting apparatus according to claim 1, which is arranged to inspect a result of said substrate working operations performed by at least one substrate working apparatus, and disposed downstream of said at least one substrate working apparatus such that the substrate-working-result inspecting apparatus and said at least one substrate working apparatus are arranged in a line.

8. A substrate-working-result inspecting apparatus according to claim 1, which is arranged to inspect a result of said substrate working operations performed by at least one substrate working apparatus, and is constructed as an integral part of one of said at least one substrate working apparatus on which said substrate working operations are performed last.

9. A substrate-working-result inspecting apparatus according to claim 1, wherein said operating-procedure determining portion selects said inspecting objects, on the basis of said substrate working information correlated with substrate-identifier information which identifies said circuit substrate.

10. A substrate-working-result inspecting apparatus according to claim 9, which is arranged to perform the inspecting operation on a circuit substrate which is provided with a substrate identifier identifying said circuit substrate,
   said substrate-working-result inspecting apparatus further comprising a substrate-identifier-information obtaining device for recognizing said substrate identifier and obtaining said substrate-identifier information of said circuit substrate.

11. A substrate-working-result inspecting apparatus for inspecting a result of substrate working operations performed on a circuit substrate, comprising:
   an inspecting device for performing an inspecting operation; and
   an inspection control device provided with;
   an operating-procedure determining portion for determining an operating procedure of said inspecting operation on said circuit substrate, on the basis of substrate working information of said working operations performed on said circuit substrate, said operating-procedure determining portion including a potentially-defective-object selecting portion for selecting, as said inspecting objects, at least potentially defective working objects from working objects for which said substrate working operations have been performed, said potentially defective working objects having a high possibility that the substrate working operations performed on said potentially-defective objects are unacceptable; and an operation control portion for controlling said inspecting device according to the determined operating procedure.

12. A substrate-working-result inspecting apparatus according to claim 11, wherein said substrate working information includes re-worked-object information relating to re-worked objects for which said substrate working operations were performed again, and wherein said potentially-defective-object selecting portion recognizes said reworked objects as said potentially defective working objects, on the basis of said re-worked-object information.

13. A substrate-working-result inspecting apparatus according to claim 11, wherein said operating-procedure determining portion determines said operating procedure of said inspecting operation, further on the basis of historical information relating to said substrate working operations, and wherein said potentially-defective-object selecting portion recognizes said potentially defective working objects, on the basis of said historical information.

14. A substrate-working-result inspecting apparatus according to claim 13, which is arranged to inspect a result of said substrate working operations performed by a substrate working apparatus provided with at least one operating device, and wherein said historical information includes at least one of device-defect information relating to a defective working operation caused by said operating device, and device-usage historical information relating to usage of said operating device, said substrate working information includes used-device information relating to said operating device which performed said substrate working operation, said potentially-defective-object selecting portion recognizing said potentially defective working objects, on the basis of at least one of said device-defect information and said device-usage historical information, and said used-device information.

15. A substrate-working-result inspecting apparatus according to claim 11, wherein said operating-procedure determining portion includes an additional-object selecting portion for selecting, as additional inspecting objects, some of said working objects which are other than said potentially defective working objects.

16. A substrate-working-result inspecting apparatus according to claim 15, wherein said additional-object selecting portion selects said additional inspecting objects such that each of all of said working objects is inspected at a frequency not lower than a predetermined threshold.

17. A substrate-working-result inspecting apparatus for inspecting a result of substrate working operations performed on a circuit substrate by a substrate working apparatus provided with at least one operating device, comprising:

an inspecting device for performing an inspecting operation;

an inspection control device provided with;

an operating-procedure determining portion for determining an operating procedure of said inspecting operation on said circuit substrate, on the basis of substrate working information of said working operations performed on said circuit substrate and historical information relating to said substrate working operations; and an operation control portion for controlling said inspecting device according to the determined operating procedure;

said historical information including at least one of device-defect historical information relating to a defective working operation caused by said operating device, and device-usage historical information relating to usage of said operating device;

said substrate working information including used-device information relating to said operating device which performed said substrate working operation; and said operating-procedure determining portion determining said operating procedure of said inspecting operation, on the basis of at least one of said device-defect historical information and said device-usage historical information, and said used-device information.

18. A substrate-working-result inspecting apparatus for inspecting a result of substrate working operations performed on a circuit substrate, comprising:

an inspecting device for performing an inspecting operation;

an inspection control device provided with;

an operating-procedure determining portion for determining an operating procedure of said inspecting operation on said circuit substrate, on the basis of substrate working information of said working operations performed on said circuit substrate; and an operation control portion for controlling said inspecting device according to the determined operating procedure;

said substrate working information including working-failure-object information relating to working-failure objects which are working objects for which said substrate working operations were not performed; and said operating-procedure determining portion including an inspecting-object excluding portion for excluding said working-failure objects from said inspecting objects, on the basis of said working-failure-object information.

19. A substrate-working-result inspecting apparatus for inspecting a result of substrate working operations performed on a circuit substrate, comprising:

an inspecting device for performing an inspecting operation; and an inspection control device provided with;

an operating-procedure determining portion for determining an operating procedure of said inspecting operation on said circuit substrate, on the basis of substrate working information of said working operations performed on said circuit substrate and historical information relating to said substrate working operations; and an operation control portion for controlling said inspecting device according to the determined operating procedure; and historical-information updating portion for updating said historical information on the basis of said substrate working information.

20. A substrate-working-result inspecting apparatus for inspecting a result of substrate working operations performed on a circuit substrate, comprising:

an inspecting device for performing an inspecting operation; and an inspection control device provided with;

an operating-procedure determining portion for determining an operating procedure of said inspecting operation on said circuit substrate, on the basis of substrate working information of said working operations performed on said circuit substrate and historical information relating to said substrate working operations; and an operation control portion for controlling said inspecting device according to the determined operating procedure; and a historical-information updating portion or updating said historical information on the basis of inspecting-result information relating to said inspection operation performed by said inspecting device.

21. An electric-circuit fabricating method including a substrate working step of performing predetermined substrate working operations on a circuit substrate, and a substrate-working-result inspecting step of inspecting a result of said substrate working operations, said substrate-working-result inspecting step comprising:

an operating-procedure determining step of determining an operating procedure of an inspecting operation to be performed on said circuit substrate, said determining the operating procedure comprising seleting objects to be inspected, on the basis of substrate working information of said substrate working operations performed on said circuit substrate in said substrate working step, and determining an order in which the selected objects are sequentially inspected; and an inspecting step of performing said inspecting operation of said circuit substrate, according to the determined operating procedure.

22. A substrate-working-result inspecting program executed by a computer, to inspect a result of substrate working operations performed on a circuit substrate, comprising:

an operating-procedure determining step of determining an operating procedure of an inspecting operation to be performed on said circuit substrate, said determining the operating procedure comprising selecting inspecting objects to be inspected, on the basis of substrate working information of said substrate working operations performed on said circuit substrate, and determining an order in which the selected inspecting objects are sequentially inspected; and an inspecting step of controlling an inspecting apparatus provided to perform said inspecting operation, according to the determined operating procedure.

23. A recording medium in which a substrate-working-result inspecting program as defined in claim 22 is stored such that said program is readable by a computer.

24. An electric-circuit fabricating system including at least one substrate working apparatus for performing predetermined substrate working operations on a circuit substrate, and a substrate-working-result inspecting apparatus for inspecting a result of said substrate working operations performed by said at least one substrate working apparatus, said substrate-working-result inspecting apparatus comprising:

an inspecting device for performing an inspecting operation; and an inspection control device provided with (a) an operating-procedure determining portion for determining an operating procedure of said inspecting operation to be performed on said circuit substrate, said operating-procedure determining portion selecting inspecting object to be inspected, on the basis of substrate working information of said substrate working operations performed on said circuit substrate by said at least one substrate working apparatus and determining an order in which the selected inspecting objects are sequentially inspected, and (b) an operation control portion for controlling said inspecting device according to the determined operating procedure.

25. An electric-circuit fabricating system according to claim 24, wherein said substrate-working-result inspecting apparatus is disposed downstream of said at least one substrate working apparatus such that the substrate-working-result inspecting apparatus and said at least one substrate working apparatus are arranged in a line.

26. An electric-circuit fabricating system according to claim 24, wherein said substrate-working-result inspecting apparatus is constructed as an integral part of one of said at least one substrate working apparatus on which said substrate working operations are performed last.

* * * * *